(12) United States Patent
Yamazaki et al.

(10) Patent No.: US 8,735,909 B2
(45) Date of Patent: May 27, 2014

(54) LIGHT EMITTING DEVICE AND METHOD OF MANUFACTURING THE SAME

(75) Inventors: Shunpei Yamazaki, Tokyo (JP); Jun Koyama, Kanagawa (JP); Mai Osada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/224,363

(22) Filed: Sep. 2, 2011

(65) Prior Publication Data

US 2011/0315993 A1    Dec. 29, 2011

Related U.S. Application Data

(60) Continuation of application No. 12/555,094, filed on Sep. 8, 2009, now Pat. No. 8,013,346, which is a division of application No. 11/109,811, filed on Apr. 20, 2005, now Pat. No. 7,629,618, which is a division of application No. 10/022,262, filed on Dec. 20, 2001, now Pat. No. 6,933,533.

(30) Foreign Application Priority Data

Dec. 21, 2000   (JP) .................................. 2000-388378

(51) Int. Cl.
*H01L 27/15* (2006.01)
(52) U.S. Cl.
USPC .......... 257/79; 257/59; 257/72; 257/E21.403; 257/E21.407
(58) Field of Classification Search
USPC .............................................. 257/59, 72, 79
See application file for complete search history.

(56) References Cited

U.S. PATENT DOCUMENTS

| 4,033,833 A | 7/1977 | Bestel et al. |
|---|---|---|
| 5,157,470 A | 10/1992 | Matsuzaki et al. |

(Continued)

FOREIGN PATENT DOCUMENTS

| CN | 1131824 A | 9/1996 |
|---|---|---|
| CN | 1259767 A | 7/2000 |

(Continued)

OTHER PUBLICATIONS

M.A. Baldo et al.; "Highly efficient phosphorescent emission from organic electroluminescent devices"; Nature, vol. 395; pp. 151-154; Sep. 10, 1998.

(Continued)

*Primary Examiner* — A. Sefer
(74) *Attorney, Agent, or Firm* — Fish & Richardson P.C.

(57) ABSTRACT

There is provided a light emitting device in which low power consumption can be realized even in the case of a large screen. The surface of a source signal line or a power supply line in a pixel portion is plated to reduce a resistance of a wiring. The source signal line in the pixel portion is manufactured by a step different from a source signal line in a driver circuit portion. The power supply line in the pixel portion is manufactured by a step different from a power supply line led on a substrate. A terminal is similarly plated to made the resistance reduction. It is desirable that a wiring before plating is made of the same material as a gate electrode and the surface of the wiring is plated to form the source signal line or the power supply line.

24 Claims, 22 Drawing Sheets

(56) References Cited

U.S. PATENT DOCUMENTS

| | | |
|---|---|---|
| 5,218,221 A | 6/1993 | Okumura |
| 5,342,806 A | 8/1994 | Asahina |
| 5,498,573 A | 3/1996 | Whetten |
| 5,536,950 A | 7/1996 | Liu et al. |
| 5,539,551 A | 7/1996 | Nomoto et al. |
| 5,576,858 A | 11/1996 | Ukai et al. |
| 5,643,826 A | 7/1997 | Ohtani et al. |
| 5,650,636 A | 7/1997 | Takemura et al. |
| 5,681,402 A | 10/1997 | Ichinose et al. |
| 5,712,495 A | 1/1998 | Suzawa |
| 5,726,461 A | 3/1998 | Shimada et al. |
| 5,756,147 A | 5/1998 | Wu et al. |
| 5,777,701 A | 7/1998 | Zhang |
| 5,815,226 A | 9/1998 | Yamazaki et al. |
| 5,851,918 A | 12/1998 | Song et al. |
| 5,856,689 A | 1/1999 | Suzawa |
| 5,861,324 A | 1/1999 | Ichinose et al. |
| 5,889,291 A | 3/1999 | Koyama et al. |
| 5,892,562 A | 4/1999 | Yamazaki et al. |
| 5,923,962 A | 7/1999 | Ohtani et al. |
| 5,929,948 A | 7/1999 | Ohori et al. |
| 5,952,675 A | 9/1999 | Katoh |
| 5,977,562 A | 11/1999 | Hirakata et al. |
| 5,990,998 A | 11/1999 | Park et al. |
| 5,990,999 A | 11/1999 | Yeo |
| 5,995,177 A | 11/1999 | Fujikawa et al. |
| 5,998,841 A | 12/1999 | Suzawa |
| 6,015,724 A | 1/2000 | Yamazaki |
| 6,023,075 A | 2/2000 | Yamazaki |
| 6,031,290 A | 2/2000 | Miyazaki et al. |
| 6,069,370 A | 5/2000 | Hayama et al. |
| 6,104,461 A | 8/2000 | Zhang et al. |
| 6,114,715 A | 9/2000 | Hamada |
| 6,118,506 A | 9/2000 | Yamazaki et al. |
| 6,137,218 A | 10/2000 | Kaneko et al. |
| 6,140,158 A | 10/2000 | Rhee et al. |
| 6,175,395 B1 | 1/2001 | Yamazaki et al. |
| 6,208,395 B1 | 3/2001 | Kanoh et al. |
| 6,228,684 B1 | 5/2001 | Maruyama |
| 6,248,634 B1 | 6/2001 | Hayama et al. |
| 6,274,887 B1 | 8/2001 | Yamazaki et al. |
| 6,277,679 B1 | 8/2001 | Ohtani |
| 6,278,131 B1 | 8/2001 | Yamazaki et al. |
| 6,281,552 B1 | 8/2001 | Kawasaki et al. |
| 6,303,963 B1 | 10/2001 | Ohtani et al. |
| 6,306,694 B1 | 10/2001 | Yamazaki et al. |
| 6,319,741 B1 | 11/2001 | Izumi et al. |
| 6,323,515 B1 | 11/2001 | Yamazaki et al. |
| 6,339,243 B1 | 1/2002 | Kwon et al. |
| 6,359,320 B1 | 3/2002 | Yamazaki et al. |
| 6,362,493 B1 | 3/2002 | Hayama et al. |
| 6,384,818 B1 | 5/2002 | Yamazaki et al. |
| 6,388,726 B1 | 5/2002 | Kim et al. |
| 6,392,255 B1 | 5/2002 | Shibata et al. |
| 6,399,988 B1 | 6/2002 | Yamazaki |
| 6,407,780 B1 | 6/2002 | Sung |
| 6,413,845 B1 | 7/2002 | Izumi et al. |
| 6,420,988 B1 | 7/2002 | Azami et al. |
| 6,429,601 B1 | 8/2002 | Friend et al. |
| 6,461,899 B1 | 10/2002 | Kitakado et al. |
| 6,469,317 B1 | 10/2002 | Yamazaki et al. |
| 6,472,594 B1 | 10/2002 | Ichinose et al. |
| 6,489,222 B2 | 12/2002 | Yoshimoto |
| 6,493,048 B1 | 12/2002 | Baek et al. |
| 6,500,701 B2 | 12/2002 | Higashi et al. |
| 6,501,098 B2 | 12/2002 | Yamazaki |
| 6,509,616 B2 | 1/2003 | Yamazaki |
| 6,518,962 B2 | 2/2003 | Kimura et al. |
| 6,524,877 B1 | 2/2003 | Nakazawa et al. |
| 6,542,137 B2 | 4/2003 | Kimura et al. |
| 6,555,420 B1 | 4/2003 | Yamazaki |
| 6,606,045 B2 | 8/2003 | Azami et al. |
| 6,614,076 B2 | 9/2003 | Kawasaki et al. |
| 6,650,379 B2 | 11/2003 | Baek et al. |
| 6,724,149 B2 | 4/2004 | Komiya et al. |
| 6,737,304 B2 | 5/2004 | Yamazaki et al. |
| 6,737,306 B2 | 5/2004 | Yamazaki et al. |
| 6,750,835 B2 | 6/2004 | Azami |
| 6,762,431 B2 | 7/2004 | Maruyama |
| 6,762,802 B2 | 7/2004 | Ono et al. |
| 6,768,521 B2 | 7/2004 | Baek et al. |
| 6,784,037 B2 | 8/2004 | Yamazaki et al. |
| 6,809,382 B2 | 10/2004 | Kawasaki et al. |
| 6,853,004 B2 | 2/2005 | Ohtani |
| 6,862,011 B2 | 3/2005 | Kimura et al. |
| 6,952,020 B1 | 10/2005 | Yamazaki et al. |
| 6,953,951 B2 | 10/2005 | Yamazaki et al. |
| 6,977,394 B2 | 12/2005 | Yamazaki et al. |
| 7,009,345 B2 | 3/2006 | Komiya et al. |
| 7,012,278 B2 | 3/2006 | Kimura et al. |
| 7,023,021 B2 | 4/2006 | Yamazaki et al. |
| 7,064,020 B2 | 6/2006 | Yamazaki |
| 7,071,487 B2 | 7/2006 | Maruyama |
| 7,123,227 B2 | 10/2006 | Azami |
| 7,132,687 B2 | 11/2006 | Kawasaki et al. |
| 7,139,045 B2 | 11/2006 | Baek et al. |
| 7,253,441 B2 | 8/2007 | Ohtani |
| 7,459,352 B2 | 12/2008 | Yamazaki et al. |
| 7,629,618 B2 | 12/2009 | Yamazaki et al. |
| 2001/0009283 A1 | 7/2001 | Arao et al. |
| 2001/0010370 A1 | 8/2001 | Kimura et al. |
| 2001/0015618 A1 | 8/2001 | Yamazaki et al. |
| 2001/0019374 A1 | 9/2001 | Izumi et al. |
| 2001/0025959 A1 | 10/2001 | Yamazaki et al. |
| 2001/0030322 A1 | 10/2001 | Yamazaki et al. |
| 2001/0040648 A1 | 11/2001 | Ono et al. |
| 2002/0001886 A1* | 1/2002 | Ohtani ............. 438/151 |
| 2002/0008797 A1 | 1/2002 | Yamazaki et al. |
| 2002/0044230 A1 | 4/2002 | Yamazaki et al. |
| 2002/0070382 A1 | 6/2002 | Yamazaki et al. |
| 2002/0076930 A1 | 6/2002 | Jo et al. |
| 2002/0110941 A1 | 8/2002 | Yamazaki et al. |
| 2002/0127833 A1 | 9/2002 | Izumi et al. |
| 2002/0158288 A1 | 10/2002 | Yamazaki et al. |
| 2002/0163457 A1 | 11/2002 | Azami et al. |
| 2002/0180721 A1 | 12/2002 | Kimura et al. |
| 2002/0190329 A1 | 12/2002 | Arai et al. |
| 2003/0038037 A1 | 2/2003 | Colgan et al. |
| 2003/0038901 A1 | 2/2003 | Baek et al. |
| 2003/0053006 A1 | 3/2003 | Baek et al. |
| 2003/0063081 A1 | 4/2003 | Kimura et al. |
| 2003/0132436 A1 | 7/2003 | Yamazaki |
| 2004/0164684 A1 | 8/2004 | Inukai et al. |
| 2004/0197971 A1 | 10/2004 | Yamazaki et al. |
| 2004/0217357 A1 | 11/2004 | Zhang et al. |
| 2004/0232421 A1 | 11/2004 | Ono et al. |
| 2004/0241895 A1 | 12/2004 | Baek et al. |
| 2005/0007507 A1 | 1/2005 | Ono et al. |
| 2005/0034043 A1 | 2/2005 | Takizawa |
| 2005/0040403 A1 | 2/2005 | Suzawa et al. |
| 2005/0056848 A1 | 3/2005 | Yamazaki et al. |
| 2005/0136578 A1 | 6/2005 | Ohtani |
| 2005/0263771 A1 | 12/2005 | Yamazaki et al. |
| 2006/0081846 A1 | 4/2006 | Yamazaki et al. |
| 2006/0202201 A1 | 9/2006 | Maruyama |
| 2006/0208258 A1 | 9/2006 | Yamazaki |
| 2006/0231846 A1* | 10/2006 | Hong et al. ............. 257/79 |
| 2006/0273317 A1 | 12/2006 | Yamazaki et al. |
| 2007/0200113 A1 | 8/2007 | Yamazaki et al. |

FOREIGN PATENT DOCUMENTS

| | | |
|---|---|---|
| CN | 1291321 A | 4/2001 |
| EP | 0372356 A2 | 6/1990 |
| EP | 0710990 A2 | 5/1996 |
| EP | 0810669 A1 | 12/1997 |
| EP | 0863495 A1 | 9/1998 |
| EP | 0923067 A1 | 6/1999 |
| EP | 0984492 A2 | 3/2000 |
| EP | 0989614 A2 | 3/2000 |
| EP | 1001467 A2 | 5/2000 |
| EP | 1005094 A2 | 5/2000 |
| EP | 1006664 A2 | 6/2000 |
| EP | 1017094 A2 | 7/2000 |

(56) References Cited

FOREIGN PATENT DOCUMENTS

| | | |
|---|---|---|
| EP | 1020920 A2 | 7/2000 |
| EP | 1028469 A2 | 8/2000 |
| EP | 1031873 A2 | 8/2000 |
| EP | 1058310 A2 | 12/2000 |
| EP | 1058484 A1 | 12/2000 |
| EP | 1394862 A2 | 3/2004 |
| EP | 1465257 A1 | 10/2004 |
| GB | 2312092 A | 10/1997 |
| JP | 1101519 A | 4/1989 |
| JP | 1289919 A | 11/1989 |
| JP | 2008821 A | 1/1990 |
| JP | 2223924 A | 9/1990 |
| JP | 3212619 A | 9/1991 |
| JP | 4232923 A | 8/1992 |
| JP | 6148685 A | 5/1994 |
| JP | 6250212 A | 9/1994 |
| JP | 7110495 A | 4/1995 |
| JP | 7130652 A | 5/1995 |
| JP | 7140475 A | 6/1995 |
| JP | 7235680 A | 9/1995 |
| JP | 7297405 A | 11/1995 |
| JP | 7297408 A | 11/1995 |
| JP | 2513739 A | 7/1996 |
| JP | 8274336 A | 10/1996 |
| JP | 8330602 A | 12/1996 |
| JP | 9-26602 A | 1/1997 |
| JP | 9026602 A | 1/1997 |
| JP | 9045930 A | 2/1997 |
| JP | 9081053 A | 3/1997 |
| JP | 9090427 A | 4/1997 |
| JP | 9106887 A | 4/1997 |
| JP | 9160509 A | 6/1997 |
| JP | 9318975 A | 12/1997 |
| JP | 10-048640 A | 2/1998 |
| JP | 10-090711 A | 4/1998 |
| JP | 10-104595 A | 4/1998 |
| JP | 10-189252 A | 7/1998 |
| JP | 10-270363 A | 10/1998 |
| JP | 11-024095 A | 1/1999 |
| JP | 11-097698 A | 4/1999 |
| JP | 11-097701 A | 4/1999 |
| JP | 2000-150906 A | 5/2000 |
| JP | 2000-223715 A | 8/2000 |
| JP | 2000-242196 A | 9/2000 |
| JP | 2000-260990 A | 9/2000 |
| JP | 2000-314900 A | 11/2000 |
| JP | 2000-321594 A | 11/2000 |
| JP | 2000-323715 A | 11/2000 |
| JP | 2000-353810 A | 12/2000 |
| JP | 2001-094238 A | 4/2001 |
| JP | 2001-313397 A | 11/2001 |
| JP | 2002-009296 A | 1/2002 |
| JP | 2002-222954 A | 8/2002 |
| KR | 1992-0008841 A | 10/1992 |
| KR | 1994-0000388 A | 1/1994 |
| KR | 2000-010923 A | 2/2000 |
| KR | 2000-067817 A | 11/2000 |
| WO | WO 98/13811 A1 | 4/1998 |
| WO | WO 99/42983 A1 | 8/1999 |

OTHER PUBLICATIONS

M.A. Baldo et al.; "Very high-efficiency green organic light-emitting devices based on electrophosphorescence"; Applied Physics Letters, vol. 75, No. 1; pp. 4-6; Jul. 5, 1999.
Chinese Office Action (Application No. 01143386.8) dated Feb. 16, 2007 (with full English translation).
International Search Report of Singapore Application No. 200107482-2, Jul. 6, 2004, 10 pages.
Office Action in Chinese Application No. 200110043386.8 dated Feb. 29, 2008 with English translation (47 total pages).
Office Action (Korean Application No. 10-2001-0081592; KR5370) dated Aug. 27, 2007, 12 total pages.
Office Action (U.S. Appl. No. 10/011,813), Jul. 13, 2004, 8 pages.
T. Tsutsui, et al., "Electroluminescence in Organic Thin Films," Photochemical Processes in Organized Molecular Systems, pp. 437-450, (1991).
T. Tsutsui et al.; "High Quantum Efficiency in Organic Light-Emitting Devices with Iridium-Complex as a Triplet Emissive Center"; Japanese Journal of Applied Physics; vol. 38, Part 2, No. 12B; pp. L1502-L1504; Dec. 15, 1999.
Stanley Wolf; "Contact-Hole and Via Filling with Selective Electroless Metal Deposition"; Silicon Processing for the VLSI ERA—vol. II; pp. 256-257; 1990.
Written Opinion (Application No. 200107527-4), Oct. 25, 2003, 7 pages.
Office Action, Malaysian Application No. 2001-0005498, dated Oct. 15, 2010, 2 pages.

* cited by examiner

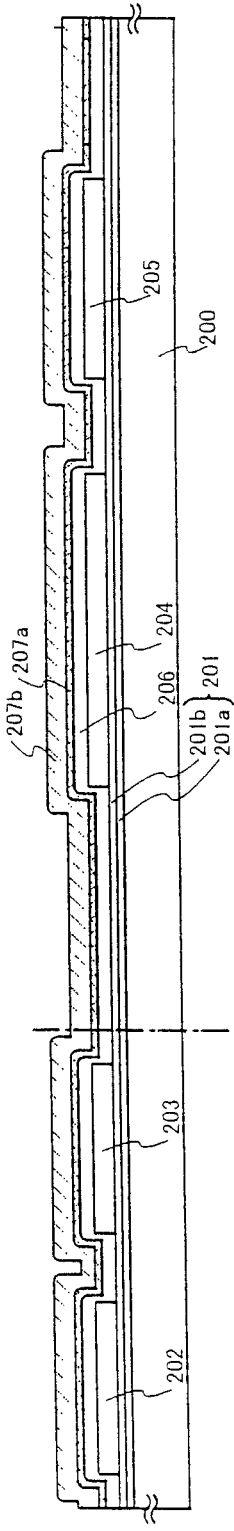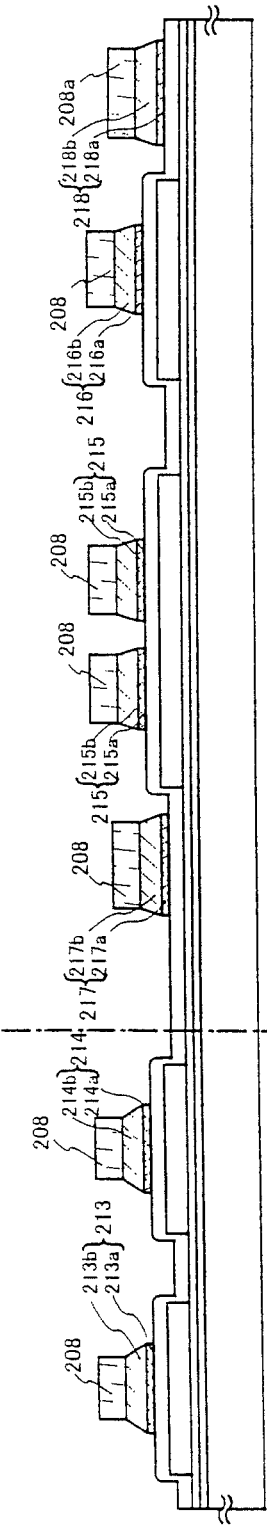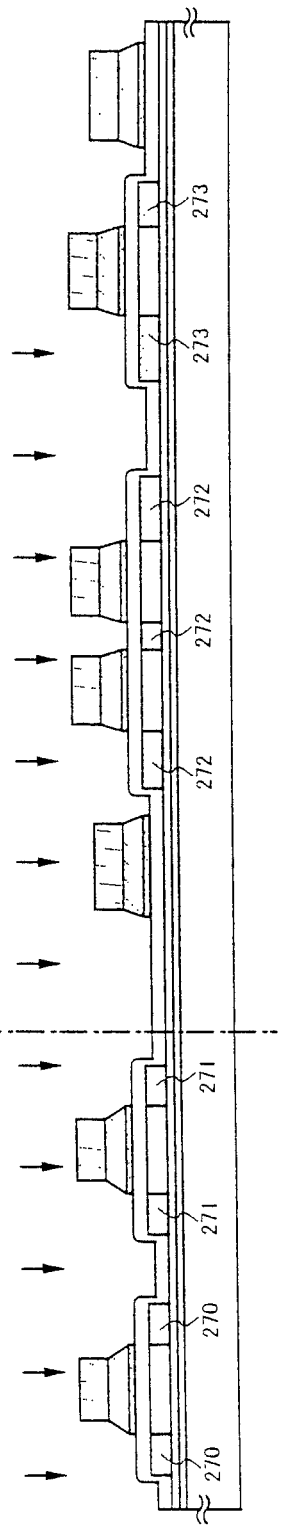

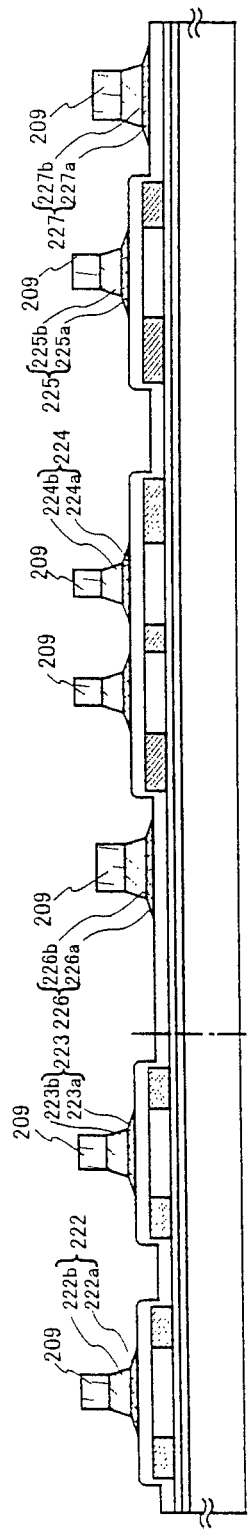
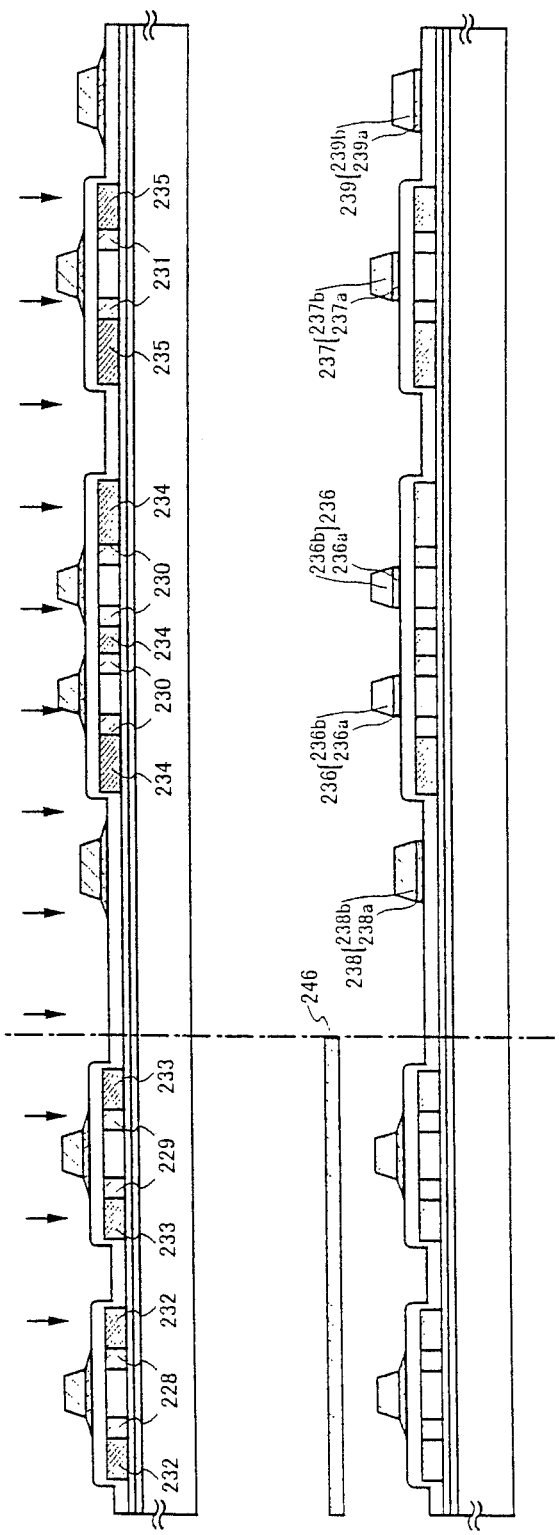
Fig. 4A
Fig. 4B
Fig. 4C

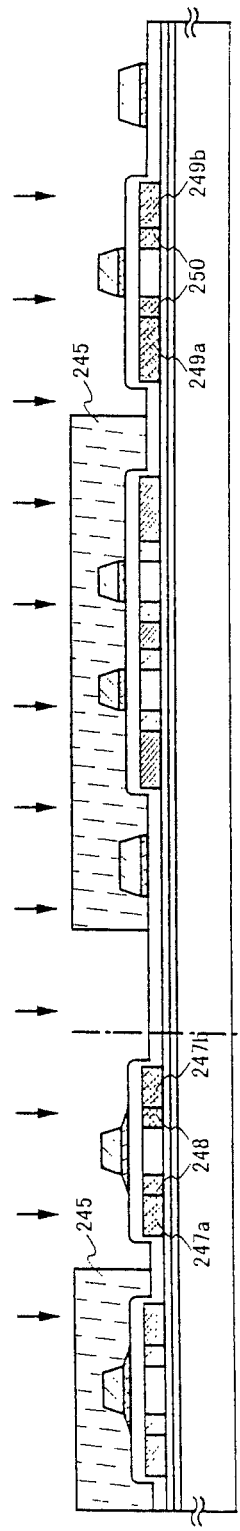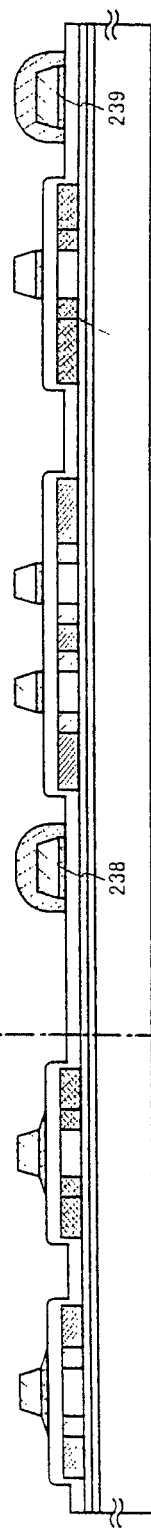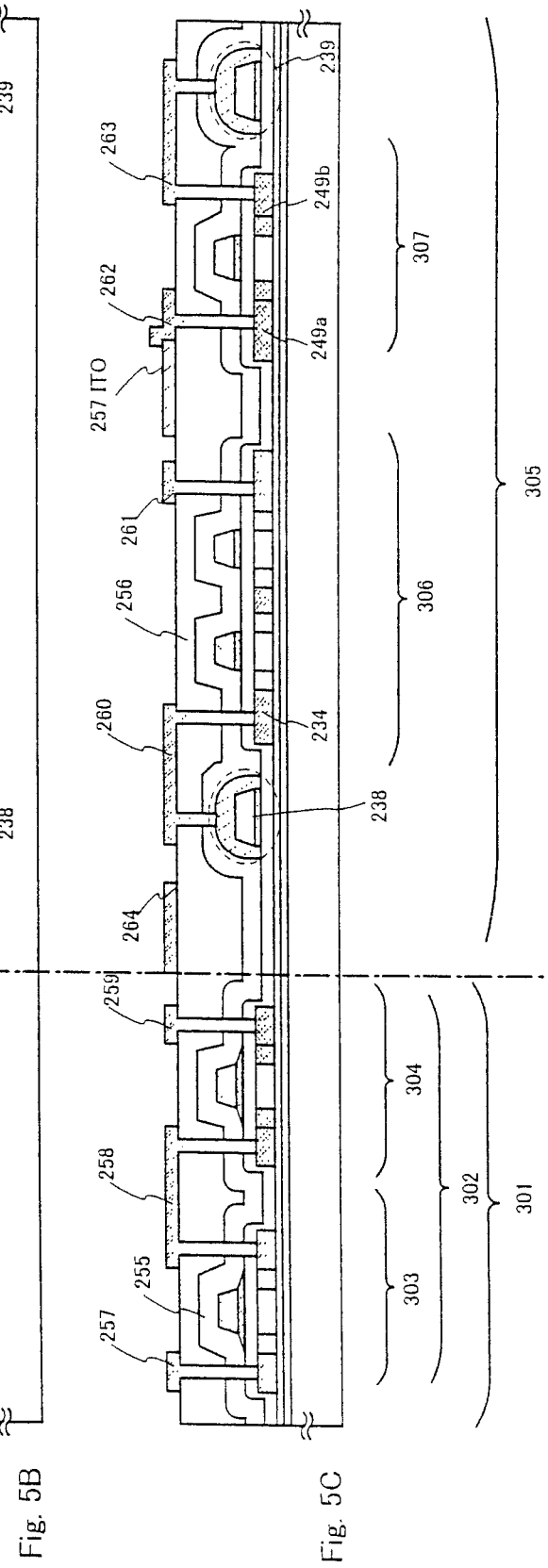
Fig. 5A
Fig. 5B
Fig. 5C

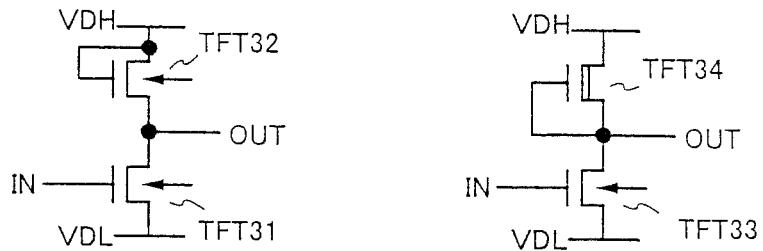
Fig. 11A EEMOS circuit        Fig. 11B EDMOS circuit
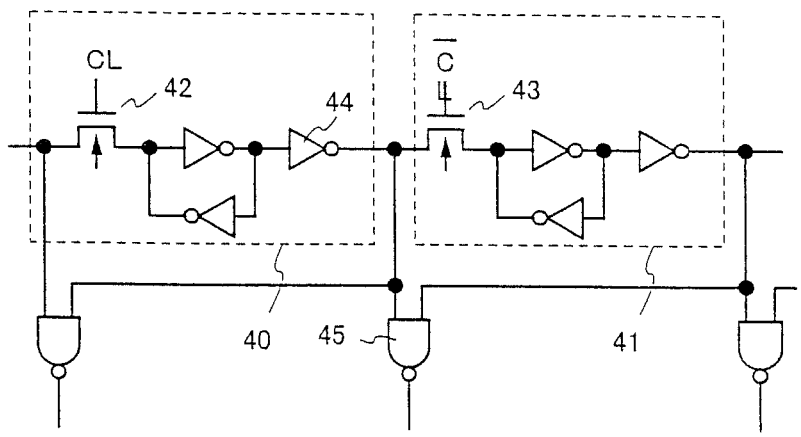
Fig. 12A
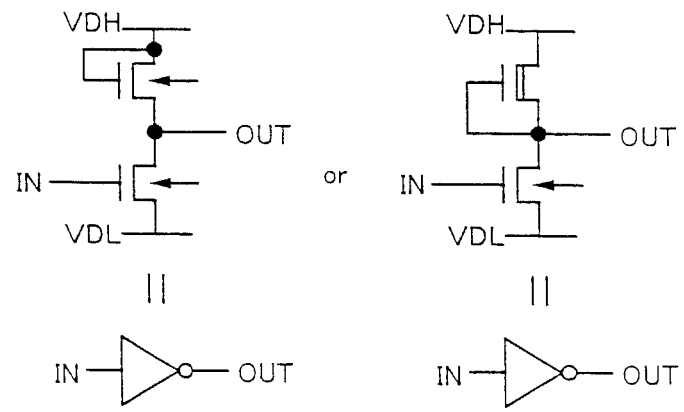
Fig. 12B

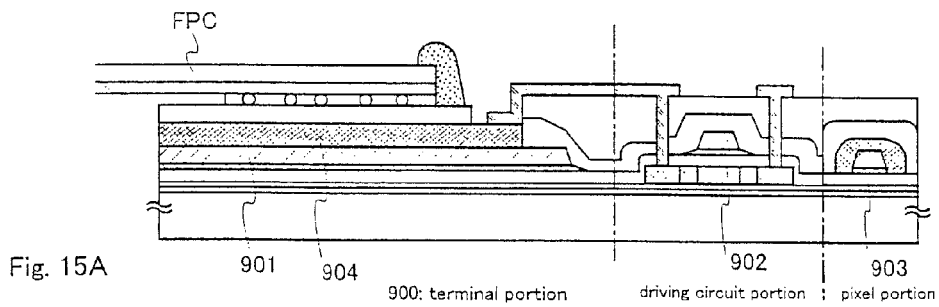
Fig. 15A     901  904
900: terminal portion     902     903
driving circuit portion   pixel portion
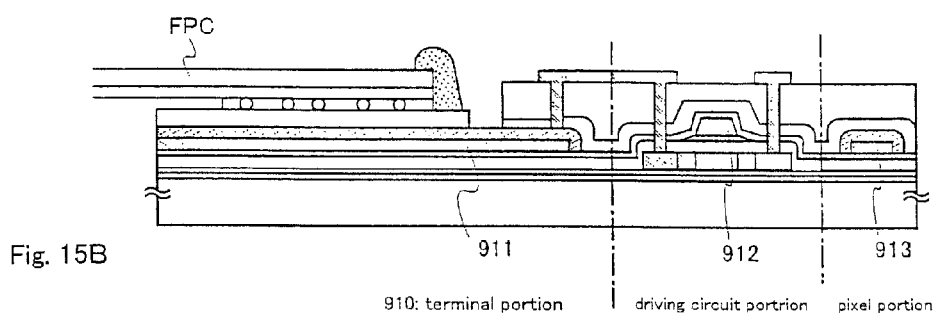
Fig. 15B     911     912     913
910: terminal portion     driving circuit portrion     pixel portion
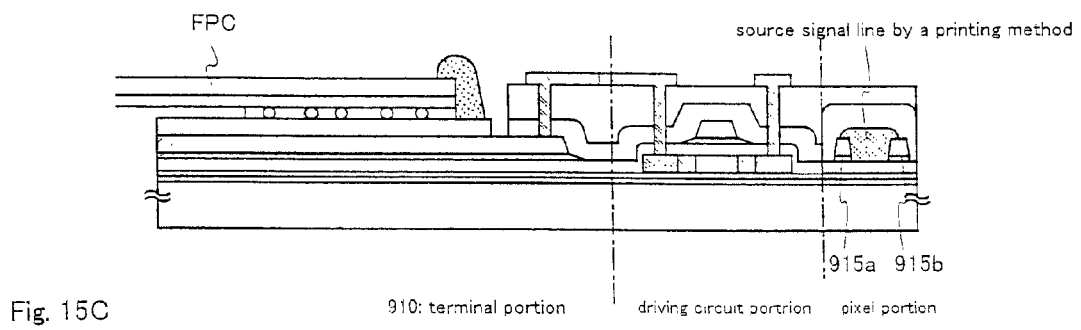
source signal line by a printing method
Fig. 15C     910: terminal portion     driving circuit portrion     915a 915b
pixel portion

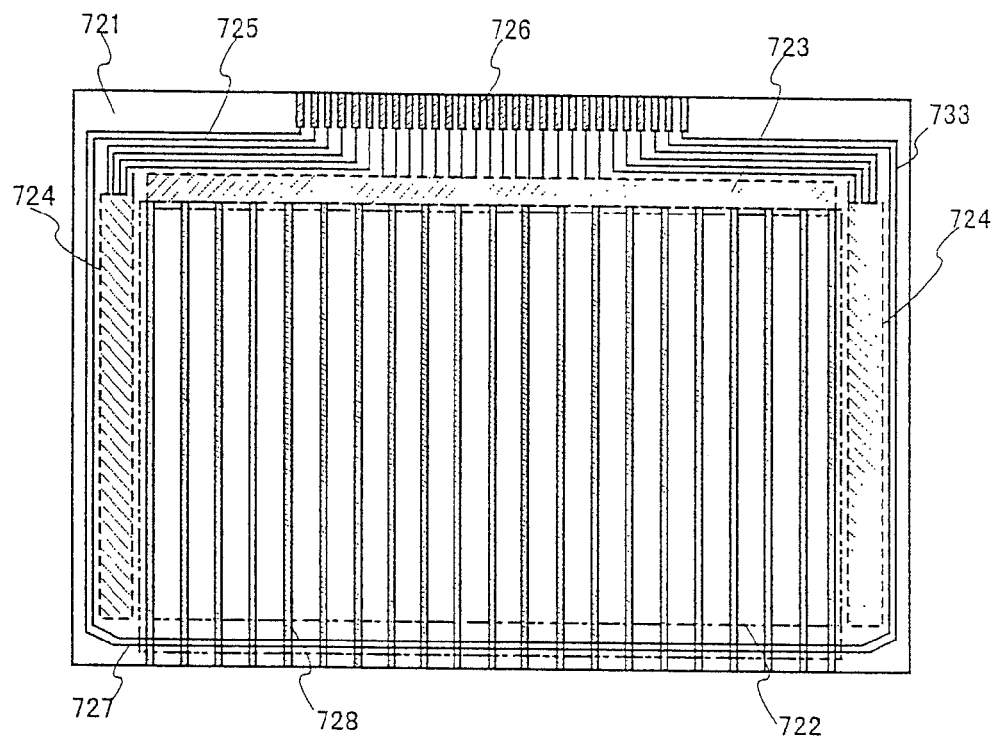
Fig. 21
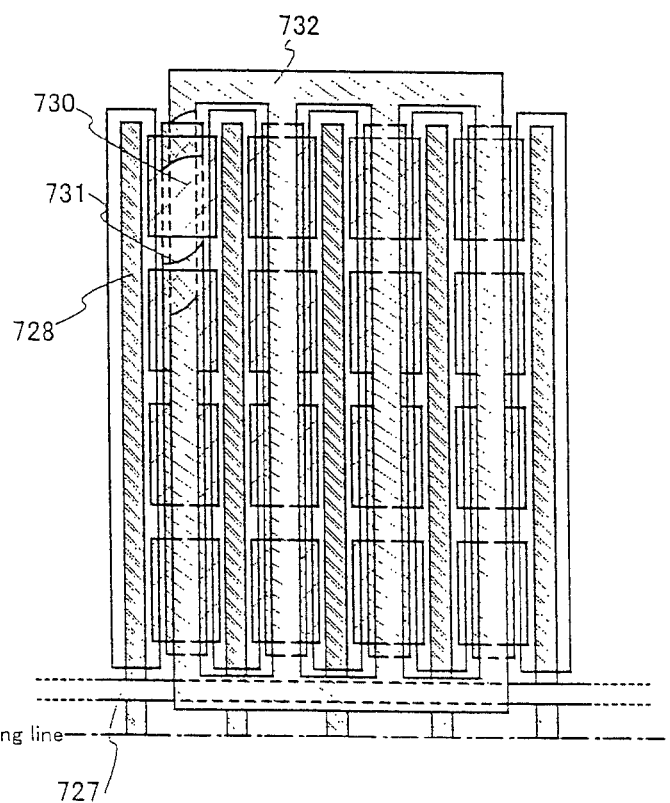
Fig. 22  substrate dividing line

LIGHT EMITTING DEVICE AND METHOD OF MANUFACTURING THE SAME

CROSS-REFERENCE TO RELATED APPLICATIONS

This application is a continuation of U.S. application Ser. No. 12/555,094, filed Sep. 8, 2009, now allowed, which is a divisional of U.S. application Ser. No. 11/109,811, filed Apr. 20, 2005, now U.S. Pat. No. 7,629,618, which is a divisional of U.S. application Ser. No. 10/022,262, filed Dec. 20, 2001, now U.S. Pat. No. 6,933,533, which claims the benefit of a foreign priority application filed in Japan as Serial No. 2000-388378 on Dec. 21, 2000, all of which are incorporated by reference.

BACKGROUND OF THE INVENTION

1. Field of the Invention

The present invention relates to a display panel in which a light emitting element formed on a substrate is sealed between the substrate and a cover member. Also, the present invention relates to a display module in which an IC is mounted in the display panel. Note that, in this specification, the display panel and the display module are generically called a light emitting device. Further, the present invention relates to electronic equipment using the light emitting device.

2. Description of the Related Art

Since a light emitting element itself emits light, visibility is high, a back light required for a liquid crystal display device (LCD) is unnecessary, it is suitable for, thinness, and there is no limitation for a view angle. Thus, recently, a light emitting device using a light emitting element is noted as a display device alternative to a CRT and an LCD.

The light emitting element has a layer including an organic compound in which luminescence (electroluminescence) is produced by applying an electric field thereto (hereinafter referred to as an organic compound layer), an anode layer, and a cathode layer. The luminescence in the organic compound includes luminescence produced when it is returned from a singlet excitation state to a ground state (fluorescence) and luminescence produced when it is returned from a triplet excitation state to the ground state (phosphorescence). In the light emitting device of the present invention, either luminescence may be employed.

Note that, in this specification, all layers provided between the anode and the cathode are defined as the organic compound layers. The organic compound layer includes specifically a light emitting layer, a hole injection layer, an electron injection layer, a hole transport layer, and an electron transport layer. Basically, the light emitting element has a structure in which the anode, the light emitting layer, and the cathode are laminated in order. In addition to this structure, there are the case where the light emitting element has a structure in which the anode, the hole injection layer, the light emitting layer, and the cathode are laminated in this order and the case where the light emitting element has a structure in which the anode, the hole injection layer, the light emitting layer, the electron transport layer, and the cathode are laminated in this order.

Also, in this specification, light emission by the light emitting element is called operation of the light emitting element. Further, in this specification, an element composed of the anode, the organic compound layer, and the cathode is called the light emitting element.

Recently, the use of an active matrix light emitting device is expanded and the needs for a large size of a screen, high definition, and high reliability are increased. Simultaneously, the improvement of productivity and the need for a low cost are increased.

In the active matrix light emitting device, a current flowing into the light emitting element is controlled by a thin film transistor (TFT) provided in respective pixels.

Conventionally, when the TFT is manufactured using aluminum as a material for a gate signal line in the above-mentioned TFT, a protrusion such as a hillock or a whisker is formed by thermal treatment and an aluminum atom is diffused into a channel forming region. Therefore, a failure in the operation of the TFT and a deterioration of a TFT characteristic are caused. To prevent this, when a metal material resistant to the thermal treatment, typically, a metal element having a high melting point is used, a wiring resistance becomes higher in the case where a screen size is made large. Thus, a problem such as an increase of consumption power is caused. With respect to the light emitting element, a consumption current is large. Therefore, particularly, in the case of a panel with 3 inches or more, due to the influence of the wiring resistance, intensities in both ends of the screen are different from each other or crosstalk is caused.

SUMMARY OF THE INVENTION

Thus, an object of the present invention is to provide a structure of a light emitting device in which low consumption power is realized even in the case of a large screen and a method of manufacturing the same.

The present invention is intended to plate a surface of a source signal line or a surface of a power supply line in a pixel portion and thus to reduce the resistance of a wiring. Note that, in the present invention, the source signal line in the pixel portion is manufactured by a process different form a process of manufacturing a source signal line in a driver circuit portion. Also, the power supply line in the pixel portion is manufactured by a process different form a process of manufacturing a power supply line led onto a substrate. Further, with respect to a terminal, the same plating is performed to reduce the resistance.

In the present invention, it is desirable that a wiring before plating is made of the same material as a gate electrode and the surface of the wiring is plated to form the source signal line or the power supply line. A film having a lower electrical resistance than the gate electrode is desirably used as a material film to be plated. Thus, the source signal line or the power supply line in the pixel portion becomes a low resistance wiring by the plating.

The present invention disclosed in this specification relates to a light emitting device including a source signal line, a light emitting element, and a TFT, characterized in that the source signal line is made from a conductor and a coating which has a lower resistance value than the conductor and covers the conductor, and that switching of the TFT is controlled in response to a signal inputted to the source signal line to control light emission of the light emitting element.

The present invention disclosed in this specification relates to a light emitting device including a power supply line, a light emitting element, and a TFT, characterized in that: the power supply line is made from a conductor and a coating which has a lower resistance value than the conductor and covers the conductor; switching of the TFT is controlled in response to a signal inputted to a gate electrode of the TFT; and that when the TFT is turned on, a potential of the power supply line is provided to a pixel electrode of the light emitting element to emit light from the light emitting element.

The present invention disclosed in this specification relates to a light emitting device including a source signal line, a power supply line, a light emitting element, and a TFT, characterized in that: the source signal line is made from a first conductor and a first coating which has a lower resistance value than the first conductor and covers the first conductor; the power supply line is made from a second conductor and a second coating which has a lower resistance value than the second conductor and covers the second conductor; switching of the TFT is controlled in response to a signal inputted to the source signal line; and that when the TFT is turned on, a potential of the power supply line is provided to a pixel electrode of the light emitting element to emit light from the light emitting element.

The device of the present invention may be characterized in that the first conductor and the second conductor are simultaneously formed.

The present invention disclosed in this specification relates to a light emitting device including a source signal line, a light emitting element, a TFT, and a terminal, characterized in that: the source signal line is made from a first conductor and a first coating which has a lower resistance value than the first conductor and covers the first conductor; the terminal is made from a second conductor and a second coating which has a lower resistance value than the second conductor and covers the second conductor; and that switching of the TFT is controlled in response to a signal inputted to the source signal line to control light emission of the light emitting element.

The device of the present invention may be characterized in that the first conductor and the second conductor are simultaneously formed.

The present invention disclosed in this specification relates to a light emitting device including a power supply line, a light emitting element, a TFT, and a terminal, characterized in that: the power supply line is made from a first conductor and a first coating which has a lower resistance value than the first conductor and covers the first conductor; the terminal is made from a second conductor and a second coating which has a lower resistance value than the second conductor and covers the second conductor; switching of the TFT is controlled in response to a signal inputted to a gate electrode of the TFT; and that when the TFT is turned on, a potential of the power supply line is provided to a pixel electrode of the light emitting element to emit light from the light emitting element.

The device of the present invention may be characterized in that the first conductor and the second conductor are simultaneously formed.

The present invention disclosed in this specification relates to a light emitting device including a pixel portion and a driver circuit, the pixel portion having a source signal line, a light emitting element, and a first TFT, the driver circuit having a second TFT and a third TFT, characterized in that: the source signal line is made from a conductor and a coating which has a lower resistance value than the conductor and covers the conductor, and that switching of the first TFT is controlled in response to a signal inputted to the source signal line to control light emission of the light emitting element.

The present invention disclosed in this specification relates to a light emitting device including a pixel portion and a driver circuit, the pixel portion having a power supply line, a light emitting element, and a first TFT, the driver circuit having a second TFT and a third TFT, characterized in that: the power supply line is made from a conductor and a coating which has a lower resistance value than the conductor and covers the conductor; switching of the first TFT is controlled in response to a signal inputted to a gate electrode of the first TFT; and that when the first TFT is turned on, a potential of the power supply line is provided to a pixel electrode of the light emitting element to emit light from the light emitting element.

The present invention disclosed in this specification relates to a method of manufacturing a light emitting device, comprising the steps of: forming a semiconductor layer on an insulating surface of a substrate; forming a gate insulating film on the semiconductor layer; forming a gate electrode and a conductor on the gate insulating film; adding an impurity element imparting an n-type to the semiconductor layer to form an n-type impurity region; forming a coating having a lower resistance than the conductor on a surface of the conductor by an electroplating method to form a source signal line; forming an insulating film covering the source signal line; and forming a gate signal line on the insulating film.

The present invention disclosed in this specification relates to a method manufacturing a light emitting device, comprising the steps of: forming a semiconductor layer on an insulating surface of a substrate; forming a gate insulating film on the semiconductor layer; forming a gate electrode and a conductor on the gate insulating film; adding an impurity element imparting an n-type to the semiconductor layer to form an n-type impurity region; forming a coating having a lower resistance than the conductor on a surface of the conductor by an electroplating, method to form a power supply line; forming an insulating film covering the power supply line; and forming a gate signal line on the insulating film.

The device of the present invention may be characterized in that the coating is formed by an electroplating method.

The device of the present invention may be characterized in that the coating includes as a main component one selected from the group consisting of Cu, Al, Au, Ag, and an alloy thereof.

The device of the present invention may be characterized in that the conductor is made of the same material as the gate electrode of the TFT.

The device of the present invention may be characterized in that the coating is formed by a printing method.

The device of the present invention may be characterized in that the first TFT, the second TFT, and the third TFT are an n-channel TFT.

The device of the present invention may be characterized in that the first TFT, the second TFT, and the third TFT are a p-channel TFT.

The device of the present invention may be characterized in that the second TFT and the third TFT compose one of an EEMOS circuit and an EDMOS circuit.

The device of the present invention may be characterized in that the second TFT is an n-channel TFT and the third TFT is a p-channel TFT.

The device of the present invention may be characterized in that the first TFT includes a gate electrode having a taper portion, a channel forming region overlapped with the gate electrode, and an impurity region partially overlapped with the gate electrode.

The device of the present invention may be characterized in that the first TFT includes a plurality of channel forming regions.

The device of the present invention may be characterized in that the first TFT includes three channel forming regions.

The device of the present invention may be characterized in that each of the second and the third TFTs includes a gate electrode having a taper portion, a channel forming region overlapped with the gate electrode, and an impurity region partially overlapped with the gate electrode.

The device of the present invention may be characterized in that the impurity region in one of the first, the second, and the third TFTs includes a region having a concentration gradient at least at an impurity concentration of $1\times10^{17}$ to $1\times10^{18}$ cm$^3$ and the impurity concentration is increased with increasing a distance from the channel forming region.

The device of the present invention may be characterized in that the light emitting device is one of an electroluminescence display device, a personal computer, and a digital versatile disk.

The method of the present invention may be characterized in that in the step using the electroplating method, the conductor is connected with a wiring so as to be the same potential.

The method of the present invention may be characterized in that the wiring connected so as to be the same potential is separated by laser light after the coating is formed.

The method of the present invention may be characterized in that the wiring connected so as to be the same potential is separated simultaneously with the substrate after plating.

BRIEF DESCRIPTION OF THE DRAWINGS

In the accompanying drawings:

FIGS. 3A to 3C show steps of manufacturing a light emitting device according to the present invention;

FIGS. 4A to 4C show steps of manufacturing the light emitting device according to the present invention;

FIGS. 5A to 5C show steps of manufacturing the light emitting device according to the present invention;

FIGS. 11A and 11B show a structure of an NMOS circuit;

FIGS. 12A and 12B show a structure of a shift register;

FIGS. 15A to 15C show a terminal portion;

FIG. 21 is a top surface view of a light emitting device;

FIG. 22 is a top surface view of a pixel portion in the light emitting device;

DETAILED DESCRIPTION OF THE PREFERRED EMBODIMENTS

Hereinafter, embodiments of the present invention will be described.

First, after a base insulating film is formed on a substrate, semiconductor layers with a desired shape are formed. Then, an insulating film (including a gate insulating film) covering the semiconductor layers is formed. A conductive film is formed on the insulating film and etched to form a gate electrode, a conductor as a source signal line in a pixel portion, a conductor as a power supply line in a pixel portion, and a conductor as an electrode of a terminal. Note that, in the present invention, a gate signal line is formed on an interlayer insulating film after the gate electrode is formed.

Next, an impurity element imparting conductivity is added to the semiconductor layers using a resist mask or the gate electrode to form impurity regions in the semiconductor layers. Note that the addition of the impurity element to the semiconductor layers may be made before the formation of the gate electrode or after the formation of the gate electrode. Also, the gate electrode may be again etched after the addition of the impurity element to the semiconductor layers.

According to the present invention, after the impurity element added to the respective semiconductor layers is activated, the plating (electroplating method) is performed to form a metal film (coating) on the surface of the conductor as the source signal line in the pixel portion, the surface of the conductor as the power supply line in the pixel portion, and the surface of the conductor as the electrode of the terminal.

Note that, in this specification, the source signal line includes both a source signal line (conductor) before plating and a source signal line after plating. The source signal line after plating including the metal film (coating) formed on the surface is called the source signal line. Similarly, the power supply line includes both a power supply line (conductor) before plating and a power supply line after plating. The power supply line after plating including the metal film (coating) formed on the surface is called the power supply line. Similarly, the terminal includes both a terminal (conductor) before plating and a terminal after plating. The terminal after plating including the metal film (coating) formed on the surface is called the terminal.

Figure 1:
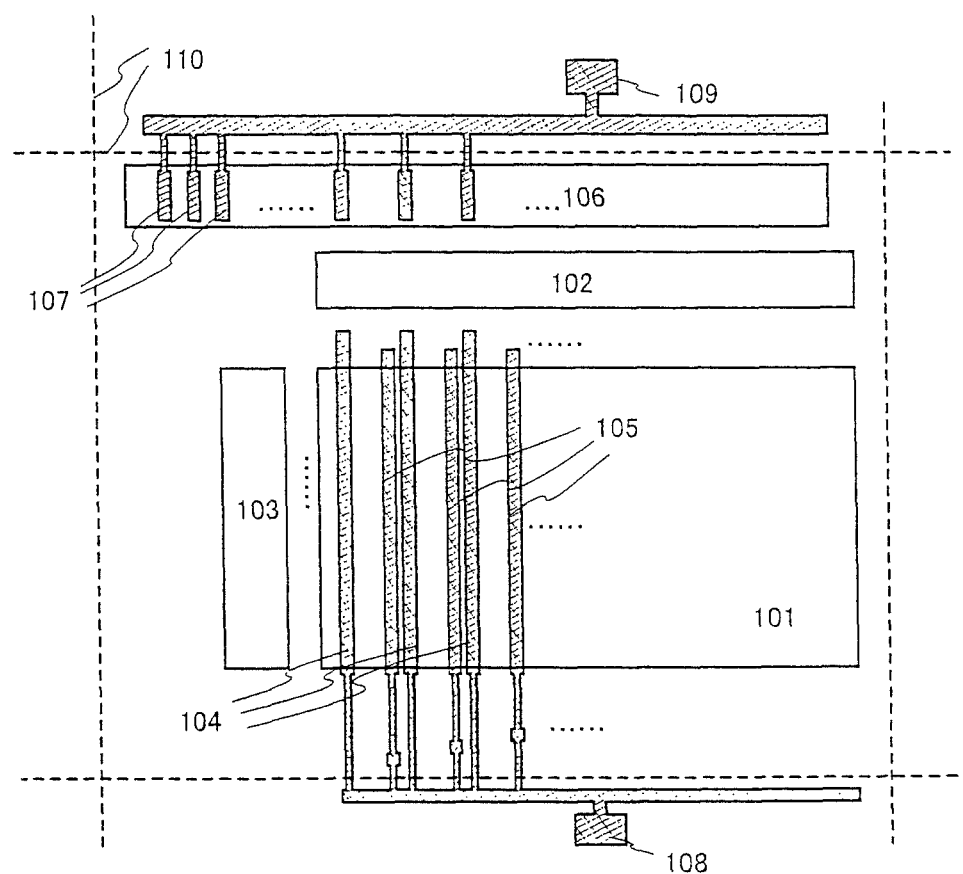
FIG. 1 is a top surface view of a light emitting device at plating.

FIG. 1 shows a state in which the metal film is formed on the surface of the conductor as the source signal line in the pixel portion, on the surface of the conductor as the power supply line in the pixel portion, and on the surface of the conductor as the terminal by an electroplating method. Note that, three source signal lines 104 in the pixel portion and only three power supply lines 105 are shown in FIG. 1. The source signal lines 104 in the pixel portion are in parallel with one another and become a belt shape. The power supply lines 105 in the pixel portion are in parallel with one another and have a belt shape. Six terminals 107 are only shown.

Reference numeral 101 denotes a pixel portion. The source signal lines 104 before plating and the power supply lines 105 before plating are provided in the pixel portion 101. The source signal lines 104 and the power supply lines 105 are connected with a plating electrode 108. Note that the source signal lines 104 before plating and the power supply lines 105 before plating are not necessarily connected with the same plating electrode 108 and may be connected with separate plating electrodes.

In a terminal portion 106, the plurality of (six) terminals 107 before plating are formed and connected with a plating electrode 109.

In this embodiment, a source side driver circuit 102 and a gate side driver circuit 103 are formed on the same substrate as the pixel portion 101. However, the source side driver circuit 102 and the gate side driver circuit 103 are not necessarily formed on the same substrate as the pixel portion 101.

Note that, in FIG. 1, the source side driver circuit 102 and the gate side driver circuit 103 are in a state before an electroplating method is performed.

Reference numeral 110 denotes substrate dividing lines. When a substrate is divided along the substrate dividing lines 110 after the plating, the source signal lines 104, the power supply lines 105, and the terminals 107 are separated from the plating electrodes 108 and 109.

The electroplating method is to flow a direct current electric current into an aqueous solution containing a metal ion to be formed by the electroplating method and thus to form a metal film on a cathode surface. As metal to be plated, a material having a lower resistance than the gate electrode, for example, copper, silver, gold, chromium, iron, nickel, platinum, an alloy thereof, or the like can be used. Since copper has an extremely low electrical resistance, it is suitable for the metal film covering the surface of the source signal line according to the present invention.

The display panel shown in FIG. 1 is immersed in an electrolyte containing a metal ion to be plated. Then, metal to be plated or insoluble metal is used for an anode and a predetermined potential difference is provided between the plating electrodes 108 and 109. Thus, metal and to be planted, which is reduced from a positive ion is precipitated in the surfaces of the source signal lines 104, the power supply lines 105, and the terminals 107.

Figure 2:
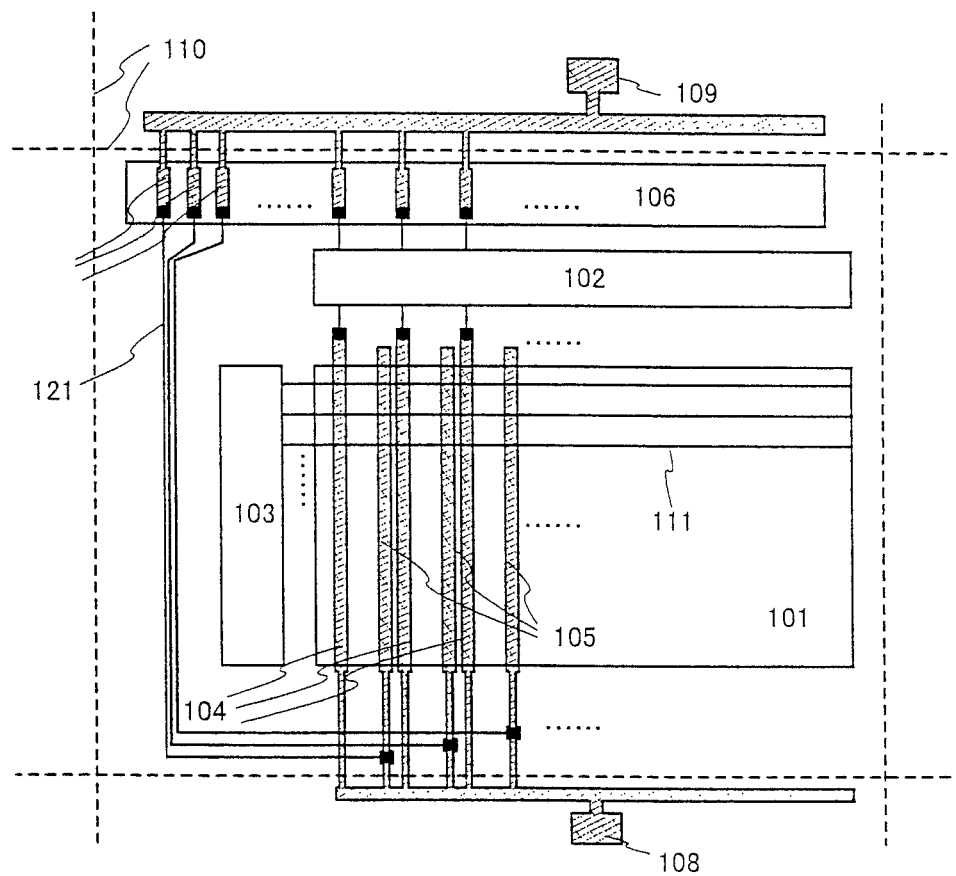
FIG. 2 is a top surface view of the light emitting device after plating.

After plating, an interlayer insulating film is formed and connection electrodes 121 connected with the impurity regions of the semiconductor layers and gate signal lines 111 are formed. In the present invention, the gate signal lines 111 are electrically connected with the gate electrodes through contact holes provided in the interlayer insulating film. FIG. 2 is a top surface view of a display panel after wirings (lead wirings) 121 for connecting the impurity regions of the semiconductor layers or the power supply lines with the terminals and the gate signal lines 111 are formed.

The source signal lines 104 in the pixel portion are electrically connected with the source side driver circuit 102. The power supply lines 105 and the terminals 107 are electrically connected with one another. The source side driver circuit 102 and the terminals 107 are electrically connected with one another.

After plating, the substrate is divided along the substrate dividing lines 110 to separate the source signal lines 104, the power supply lines 105, and the terminals 107 from the plating electrodes 108 and 109.

A film thickness of the metal film formed by the electroplating method can be suitably set by controlling a current density and a time by an operator.

Thus, according to the present invention, the source signal lines in the pixel portion, the power supply lines in the pixel portion, and the terminals are covered with the metal material having a low resistance. Therefore, even if the pixel portion has a large area, high speed drive can be sufficiently made.

In particular, when the resistance of the power supply lines is lowered, a potential drop of the power supply lines by a wiring resistance is prevented and thus crosstalk can be prevented.

Here, an example in which the source signal lines in the pixel portion, the power supply lines in the pixel portion, and the terminals are formed together with the gate electrode. However, those and gate electrode may be separately formed. For example, after an impurity element is added to the respective semiconductor layers, an insulating film for protecting the gate electrode is formed, the impurity element added to the respective semiconductor layers is activated, and the source signal lines in the pixel portion, the power supply lines in the pixel portion, and the terminals, which are made of a metal material having a low resistance (typically, a material containing mainly aluminum, silver, and copper), are simultaneously formed on the insulating film by a photolithography step. The source signal lines in the pixel portion, the power supply lines in the pixel portion, and the terminals, which are thus obtained, are plated. In order to reduce the number of masks, the source signal lines in the pixel portion and the power supply lines in the pixel portion may be formed by a printing method.

In this embodiment, the source signal lines in the pixel portion, the power supply lines in the pixel portion, and the terminals are covered with the metal material having a low resistance by the plating method. However, either the source signal lines in the pixel portion or the power supply lines in the pixel portion is preferably covered with the metal material having a low resistance by the plating method.

According to the present invention, in the active matrix light emitting device, even if the area of the pixel portion becomes larger and thus a large screen is obtained, preferable display can be realized.

With respect to the present invention having the above structure, more detailed descriptions will be made with reference to embodiments below.

Embodiment 1

In this embodiment, a method of simultaneously manufacturing TFTs composing a pixel portion and TFTs composing a driver circuit provided in the vicinity of the pixel portion (CMOS circuit composed of an n-channel TFT and a p-channel TFT) on the same substrate will be described with reference to FIGS. 3A to 3c to FIG. 6.

First, in this embodiment, a substrate 200 made of glass such as barium borosilicate glass (represented by #7059 glass, #1737 glass, or the like, which is produced by Corning Corporation) or aluminoborosilicate glass is used. The substrate 200 is not particularly limited if it has translucency, and a quartz substrate may be used. Also, a plastic substrate having a heat resistance resistant to a processing temperature in this embodiment may be used.

Next, a base film 201 made from an insulating film such as a silicon oxide film, a silicon nitride film, or a silicon oxynitride film is formed on the substrate 200. In this embodiment, a two layers structure is used for the base film 201. However, a single layer film of the insulating film or a structure in which two layers or more are laminated may be used. As a first layer of the base film 201, a silicon oxynitride film 201a is formed at 10 to 200 nm (preferably, 50 to 100 nm) by a plasma CVD method using $SiH_4$. $NH_3$, and $N_2O$ as reactive gases. In this embodiment, the silicon oxynitride film 201a (composition ratio: Si=32%, O=27%, N=24%, and H=17%) having a film thickness of 50 nm is formed. As a second layer of the base film 201, a silicon oxynitride film 201b is laminated at a thickness of 50 to 200 nm (preferably, 100 to 150 nm) by a plasma CVD method using $SiH_4$ and $N_2O$ as reactive gases. In this embodiment, the silicon oxynitride film 201b (composition ratio: Si=32%, O=59%, N=7%, and H=2%) having a film thickness of 100 nm is formed.

Then, semiconductor layers 202 to 205 are formed on the base film as follows: after a semiconductor film having an amorphous structure is formed by a known means (such as a sputtering method, an LPCVD method, or a plasma CVD method), a known crystallization processing (such as a laser crystallization method, a thermal crystallization method, or a thermal crystallization method using a catalyst such as nickel) is performed to obtain a crystalline semiconductor film, and then the crystalline semiconductor film is patterned to a desired shape. The semiconductor layers 202 to 205 are formed to have a thickness of 25 to 80 nm (preferably, 30 to 60 nm). There is no limitation to a material for the crystalline semiconductor film. However, it is preferably made of silicon, a silicon germanium alloy, or the like. In this embodiment, after an amorphous silicon film having a thickness of 55 nm is formed by a plasma CVD method, a solution including nickel is held on the amorphous silicon film. After the amorphous silicon film is dehydrogenated at 500° C. for 1 hour, thermal crystallization is performed at 550° C. for 4 hours and a laser anneal processing for improving crystallization is performed to form the crystalline silicon film. Then, the crystalline silicon film is patterned using a photolithography method to form the semiconductor layers 202 to 205.

After the formation of the semiconductor layers 202 to 205, a trace impurity element (boron or phosphorus) may be suitably doped to separately form an enhancement type and a depletion type.

When the crystalline semiconductor film is formed by a laser crystallization method, an excimer laser, a YAG laser, or a $YVO_4$ laser is used, which is a pulse oscillation type or a continuous light emitting type. When these lasers are used, a method of linearly condensing laser light emitted from a laser oscillator by an optical system and irradiating it to the semiconductor film is preferably used. A crystallization condition is suitably selected by an operator. When the excimer layer is used, a pulse oscillation frequency is set to be 300 [Hz] and a laser energy density is set to be 100 to 400 [mJ/cm$^2$] (typically, 200 to 300 [mJ/cm$^2$]). When the YAG laser is used, it is desirable that its second harmonic is used, a pulse oscillation frequency is set to be 30 to 300 [kHz], and a laser energy density is set to be 300 to 600 [mJ/cm$^2$] (typically, 350 to 500 [mJ/cm$^2$]). Laser light is linearly condensed with a width of 100 to 1000 [μm], for example, 400 [μm] and irradiated onto the entire surface of the substrate. At this time, an overlap ratio of the linear laser light is set to be 50 to 90[%].

Note that a gas laser or a solid laser, which performs continuous oscillation or pulse oscillation can be used as the laser. There are an excimer laser, an Ar laser, a Kr laser, and the like as the gas laser. Also, there are a YAG laser, a $YVO_4$ laser, a YLF laser, a $YAlO_3$ laser, a glass laser, a ruby laser, an alexandrite laser, a Ti: sapphire laser, and the like as the solid laser. A laser using a crystal such as YAG, $YVO_4$, YLF or $YAlO_3$, which is doped with Cr, Nd, Er, Ho, Ce, Co, Ti, or Tm can be also used as the solid laser. The fundamental of the laser is changed dependent on a doping material and laser light having a fundamental of the neighborhood of 1 μm is obtained. A harmonic to the fundamental can be obtained by using a non-linear optical element.

Also, after infrared laser light emitted from the solid laser is converted into green laser light by a non-linear optical element, ultraviolet laser light obtained by another non-linear optical element can be used.

In order to obtain a crystal having a large grain size at the crystallization of the amorphous semiconductor film, it is preferable that a solid laser capable of performing continuous oscillation is used and a second harmonic to a fourth harmonic of the fundamental are applied. Typically, a second harmonic (532 nm) or a third harmonic (355 nm) of an Nd: $YVO_4$ laser (fundamental of 1064 nm) is desirably applied. Concretely, laser light emitted from the continuous oscillation $YVO_4$ laser having an output of 10 W is converted into a harmonic by a non-linear optical element. Also, there is a method of emitting a harmonic by locating a $YVO_4$ crystal and a non-linear optical element in a resonator. Preferably, laser light having a rectangular shape or an elliptical shape is formed on an irradiation surface by an optical system and irradiated to an object to be processed. At this time, an energy density of about 0.01 to 100 MW/cm$^2$ (preferably, 0.1 to 10 MW/cm$^2$) is required. The semiconductor film is moved relatively to the laser light at a speed of about 10 to 2000 cm/s and irradiated with it.

Then, a gate insulating film 206 covering the semiconductor layers 202 to 205 is formed. The gate insulating film 206 is formed using an insulating film including silicon at a thickness of 40 to 150 nm by a plasma CVD method or a sputtering method. In this embodiment, a silicon oxynitride film (composition ratio: Si=32%, O=59%, N=7%, and H=2%) is formed to have a thickness of 115 nm by the plasma CVD method. Of course, the gate insulating film is not limited to the silicon oxynitride film and thus another insulating film including silicon may be used as a single layer or a laminate structure.

Then, as shown in FIG. 3A, a first conductive film 207a having a film thickness of 20 to 100 nm and a second conductive film 207b having a film thickness of 100 to 400 nm are laminated on the gate insulating film 206. In this embodiment, the first conductive film 207a made from a TaN film having a film thickness of 30 nm and the second conductive film 207b made from a W film having a film thickness of 370 nm are laminated. The TaN film is formed by a sputtering method using Ta as a target in an atmosphere including nitrogen. The W film is formed by a sputtering method using W as a target. In addition, it can be formed by a thermal CVD method using tungsten hexafluoride ($WF_6$). In any case, when these films are used for a gate electrode, it is necessary to lower the resistance and a resistivity of the W film is desirably made to 20 μΩcm or lower. When a crystal grain is enlarged, the resistivity of the W film can be lowered. However, if a large number of impurity elements such as oxygen are present in the W film, the crystallization is suppressed and thus the resistance is increased. Therefore, in this embodiment, the W film is formed by a sputtering method using high purity W (purity of 99.9999% or 99.99%) as a target after due consideration such that an impurity is not entered therein from a gas phase at film formation. Thus, a resistivity of 9 to 20 μΩcm can be realized.

Note that, in this embodiment, TaN is used for the first conductive film 207a and W is used for the second conductive film 207b. However, the present invention is not particularly limited to these materials, and an element selected from Ta, W, Ti, Mo, Al, Cu, Cr, and Nd, or an alloy material or a compound material, which includes as the main component the above element may be used for forming the respective conductive films. Also, a semiconductor film which is represented by a polycrystalline silicon film doped with an impurity element such as phosphorus may be used. Further, there are a combination in which the first conductive film is made from a tantalum (Ta) film and the second conductive film is made from a W film, a combination in which the first conductive film is made from a titanium nitride (TiN) film and the second conductive film is made from a W film, a combination in which the first conductive film is made from a tantalum nitride (TaN) film and the second conductive film is made from an Al film, and a combination in which the first conductive film is made from a tantalum nitride (TaN) film and the second conductive film is made from a Cu film.

Next, a mask 208 made of a resist is formed by a photolithography method and a first etching processing for forming electrodes and wirings is performed. The first etching processing is performed under a first etching condition and a second etching condition. In this embodiment, as the first etching condition, an ICP (inductively coupled plasma) etching method is used. Also, $CF_4$, $Cl_2$, and $O_2$ are used as etching gases and a ratio of respective gas flow rates is set to be 25/25/10 (sccm). RF power having 500 W and 13.56 MHz is supplied to a coil type electrode at a pressure of 1 Pa to produce plasma and thus to perform etching. Note that a chlorine system gas represented by $Cl_2$, $BCl_3$, $SiCl_4$, $CCl_4$, and the like, a fluorine system gas represented by $CF_4$, $SF_6$, $NF_3$, or the like, or $O_2$ can be suitably used as an etching gas. Here, a dry etching apparatus (Model E645-□ICP) using ICP, which is produced by Matsushita Electric Industrial Co., Ltd. is used. Also, RF power having 150 W and 13.56 MHz is supplied to a substrate side (sample stage) to apply a substantially negative self bias voltage. The W film is etched under this first etching condition such that end portions of the first conductive layer become taper shapes. An etching rate of W in the first etching condition is 200.39 nm/min. and an etching rate of TaN is 80.32 nm/min. A selection ratio of W to TaN is about 2.5. In the first etching condition, a taper angle of W becomes about 26°.

After that, the etching condition is changed to the second etching condition without removing the mask 208 made of a resist. That is, $CF_4$ and $Cl_2$ are used as etching gases and a ratio of respective gas flow rates is set to be 30/30 (sccm). RF power having 500 W and 13.56 MHz is supplied to a coil type electrode at a pressure of 1 Pa to produce plasma and thus to perform etching for about 30 seconds. Also, RF power having 20 W and 13.56 MHz is supplied to a substrate side (sample stage) to apply a substantially negative self bias voltage. In the second etching condition such as $CF_4$ and $Cl_2$ are mixed, both the W film and TaN film are etched to the same degree. An etching rate of W in the second etching condition is 58.97 nm/min. and an etching rate of TaN is 66.43 nm/min. Note that, in order to perform etching without leaving the residue on the gate insulating film, an etching time is preferably increased at a rate of about 10 to 20%.

In the above first etching processing, when a shape of the mask made of a resist is suitable, the end portions of the first and second conductive layers become taper shapes because of an effect of the bias voltage applied to the substrate side. An angle of the taper portions is preferably set to be 15° to 45°.

Thus, first shaped conductive layers 213 to 218 made from the first conductive layers and the second conductive layers (first conductive layers 213a to 218a and second conductive layers 213b to 218b) are formed by the first etching processing (FIG. 3B). Although not shown, in the insulating film 206 which is an gate insulating film, regions which are not covered with the first shaped conductive layers 213 to 218 are etched at about 10 to 20 nm, and thus thinner regions are formed.

Then, a first doping processing is performed without removing the mask made of a resist to add an impurity element imparting an n-type to the semiconductor layers (FIG. 3C). The doping processing is preferably performed by an ion doping method or an ion implantation method. As a condition of the ion doping method, a dose is set to be $1 \times 10^{13}$ to $5 \times 10^{15}/cm^2$ and an accelerating voltage is set to be 60 to 100 keV. In this embodiment, a dose is set to be $1.5 \times 10^{15}/cm^2$ and an accelerating voltage is set to be 80 keV. As the impurity element imparting an n-type, an element which belongs to group 15 of Periodic table, typically, phosphorus (P) or arsenic (As) is used. Here, phosphorus (P) is used. In this case, the conductive layers 213 to 216 become masks to the impurity element imparting an n-type and thus n-type impurity regions (high concentrations) 270 to 273 are formed in a self alignment. The impurity element imparting an n-type is added to the impurity regions 270 to 273 at a concentration range of $1 \times 10^{20}$ to $1 \times 10^{21}/cm^3$.

Next, a second etching processing is performed without removing the mask made of a resist. Here, $SF_6$, $Cl_2$, and $O_2$ are used as etching gases and a ratio of respective gas flow rates is set to be 24/12/24 (sccm). RF power having 700 W and 13.56 MHz is supplied to a coil type electrode at a pressure of 1.3 Pa to produce plasma and thus to perform etching for 25 seconds. Also, RF power having 10 W and 13.56 MHz is supplied to a substrate side (sample stage) to apply a substantially negative self bias voltage. An etching rate of W in the second etching processing is 227.3 nm/min., an etching rate of TaN is 32.1 nm/min., and a selection ratio of W to TaN is 7.1. Also, an etching rate of SiON as the insulating film 206 is 33.7 nm/min. and a selection ratio of W to TaN is 6.83. Thus, when $SF_6$ is used as an etching gas, since a selection ratio to the insulating film 206 is high, film reduction can be suppressed.

By the second etching processing, a taper angle of the second conductive layers (W) becomes about 70°. Second conductive layers 222b to 227b are formed by the second etching processing. On the other hand, the first conductive layers are hardly etched and thus first conductive layers 222a to 227a are formed. Also, the mask 208 made of a resist is deformed to a mask 209 made of a resist by the second etching processing (FIG. 4A). Although not shown, actually, the width of the first conductive layer after the second etching processing is narrowed by about 0.15 µm, that is, by about 0.3 µm in an entire line width, as compared with that before the second etching processing. Here, the width of the second conductive layer in a channel length direction corresponds to the second width indicated in the above embodiment.

In the above second etching processing, $CF_4$, $Cl_2$, and $O_2$ can be used as etching gases. In this case, preferably, a ratio of respective gas flow rates is set to be 25/25/10 (sccm) and RF power having 500 W and 13.56 MHz is supplied to a coil type electrode at a pressure of 1. Pa to produce plasma and thus to perform etching. Also, RF power having 20 W and 13.56 MHz is supplied to a substrate side (sample stage) to apply a substantially negative self bias voltage. An etching rate of W in the case where $CF_4$, $Cl_2$, and $O_2$ are used is 124.62 nm/min. and an etching rate of TaN is 20.67 nm/min. A selection ratio of W to TaN is 6.05. Therefore, the W film is selectively etched. In this case, in the insulating film 206, regions which are not covered with the first shaped conductive layers 222 to 227 are etched at about 50 nm, and thus thinner regions are formed.

Next, after the mask made of a resist is removed, a second doping processing is performed to obtain a state as shown in FIG. 4B. The second conductive layers 222b to 225b are used as masks to an impurity element and doping is performed such that the impurity element is added to the semiconductor layers under the taper portions in the first conductive layers 222a to 225a. In this embodiment, phosphorus (P) is used as the impurity element and plasma doping is performed under a doping condition having a dose of $1.5 \times 10^{14}/cm^2$, an accelerating voltage of 90 keV, an ion current density of 0.5 µA/cm², a 5% hydrogen dilution gas of phosphine ($PH_3$), and a gas flow rate of 30 sccm. Thus, impurity regions (low concentrations) 228 to 231 overlapped with the first conductive layers are formed in a self alignment. A concentration of phosphorus (P) added to the impurity regions 228 to 231 is $1 \times 10^{17}$ to $1 \times 10^{19}/cm^3$ and has a concentration gradient in accordance with a film thickness of the taper portions in the first conductive layers. Note that the impurity concentration (P concentration) in the semiconductor layers overlapped with the taper portions of the first conductive layer is gradually decreased from the end portions of the taper portions in the first conductive layer to the inside. That is, a concentration distribution is formed by the second doping processing. Also, the impurity element is added to the impurity regions (high concentrations) 270 to 273 to form impurity regions (high concentrations) 232 to 235.

Note that, in this embodiment, a width of the taper portion (width in a channel length direction) is preferably 0.5 μm or more and its limitation is 1.5 μm to 2 μm. Thus, although it is dependent on a film thickness, the limitation of a width of the impurity region (low concentration) having a concentration gradient in a channel length direction becomes 1.5 μm to 2 μm. Although the impurity regions (high concentration) and the impurity regions (low concentration) are separately shown here, there are actually no specific boundaries and regions having a concentration gradient are formed. Similarly, there are no specific boundaries between the channel forming region and the impurity regions (low concentrations).

Then, a third etching processing is performed while a region except for a pixel portion is covered with a mask 246. As the mask 246, a metal plate, a glass plate, a ceramic plate, or a ceramic glass plate is preferably used. In the third etching processing, the taper portions of the first conductive layers in a region which is not overlapped with the mask 246 are selectively etched such that regions overlapped with the impurity regions of the semiconductor layers are not present. The third etching processing is performed by an ICP etching apparatus using. $Cl_3$ having a high selection ratio to W as an etching gas. In this embodiment, a gas flow rate of $Cl_3$ is set to be 80 (sccm) and RF power having 350 W and 13.56 MHz is supplied to a coil type electrode at a pressure of 1.2 Pa to produce plasma and thus to perform etching for 30 seconds. Also, RF power having 50 W and 13.56 MHz is supplied to a substrate side (sample stage) to apply a substantially negative self bias voltage. By the third etching processing, conductive layers 236 (first conductive layers 236a and second conductive layers 236b), a conductive layer 237 (first conductive layer 237a and second conductive layer 237b), a conductive layer 238 (first conductive layer 238a and second conductive layer 238b), and a conductive layer 239 (first conductive layer 239a and second conductive layer 239b) are formed. Note that the conductive layer 238 becomes a source signal line and the conductive layer 239 becomes a power supply line (FIG. 4C).

In this embodiment, the example in which the third etching processing is performed is indicated. However, if the third etching processing is not required, it is unnecessary to perform it.

Next, as shown in FIG. 5A, after the mask made of a resist is removed, a mask 245 made of a resist is newly formed and a third doping processing is performed. By the third doping processing, impurity regions 247 to 250 to which an impurity element imparting a conductivity type (p-type) opposite to the above one conductivity type (n-type) is added are formed in the semiconductor layers as active layers of p-channel TFTs. The impurity element imparting the p-type is added using the conductive layers 223 and 237 as masks to the impurity element to form impurity regions in a self alignment.

In this embodiment, the impurity regions 247 to 250 are formed by an ion doping method using diborane ($B_2H_6$). Note that the impurity region 247 includes impurity regions 247a and 247b. Also, the impurity region 249 includes impurity regions 249a and 249b. In the third doping processing, the semiconductor layers composing n-channel TFTs are covered with the mask 245 made of a resist. Although phosphorus is added to the impurity regions 247 to 250 at different concentrations by the first doping processing and the second doping processing, a doping processing is performed such that a concentration of the impurity element imparting the p-type in any region becomes $2\times10^{20}$ to $2\times10^{21}$ atoms/$cm^3$. Thus, since those impurity regions function as the source regions and the drain regions of the p-channel TFTs, no problem is caused.

Next, a step of activating the impurity element added to the respective semiconductor layers is performed. This activation step is performed by a thermal anneal method using a furnace anneal furnace. The thermal anneal method is preferably performed in a nitrogen atmosphere at an oxygen concentration of 1 ppm or lower, preferably 0.1 ppm or lower and 400 to 700° C., typically 500 to 550° C. In this embodiment, the activation processing is performed by thermal treatment at 550° C. for 4 hours. Note that a laser anneal method or a rapid thermal anneal method (RTA method) can be applied in addition to the thermal anneal method.

Although not shown, the impurity element is diffused by the activation processing. Thus, the boundaries between the n-type impurity regions (low concentrations) and the n-type impurity regions (high concentrations) are hardly present.

Note that, in this embodiment, simultaneously with the above activation processing, nickel used as a catalyst upon crystallization is gettered by the impurity regions including phosphorus at a high concentration and a nickel concentration in the semiconductor layers, which becomes the channel forming regions is mainly decreased. With respect to the TFTs having the channel forming regions, which are thus manufactured, an off current is reduced and crystallinity is preferable. Therefore, a high field effect mobility is obtained and a preferable characteristic can be achieved.

Further, thermal treatment is performed in a hydrogen atmosphere to hydrogenate the semiconductor layers. As another means for hydrogenation, plasma hydrogenation (hydrogen excited by plasma is used) may be performed.

In this embodiment, when a laser anneal method is used, a laser used upon crystallization can be used. In the case of activation, the same moving speed as the that of crystallization and an energy density of about 0.01 to 100 MW/$cm^2$ (preferably 0.01 to 10 MW/$cm^2$) are required.

Figure 7A:
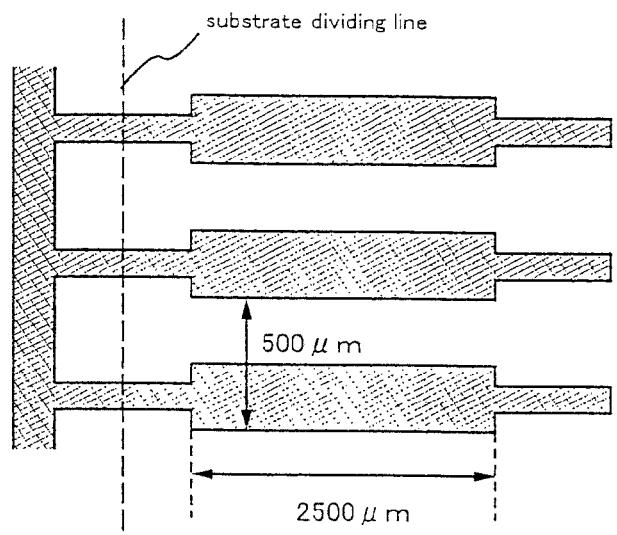
FIGS. 7A and 7B show a terminal portion.
Figure 7B:
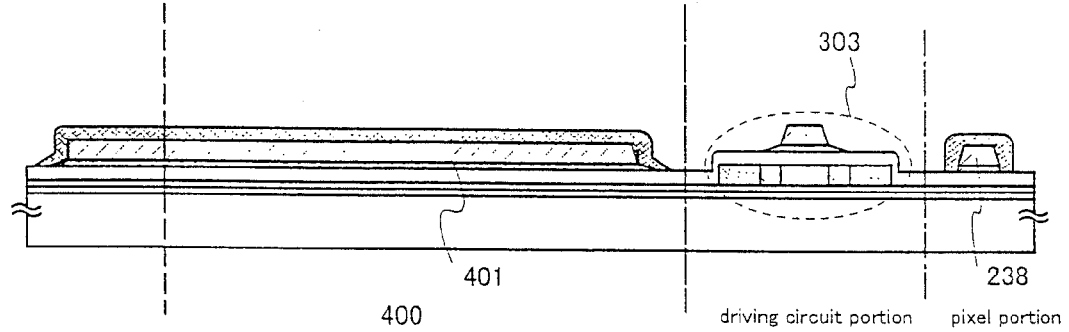

Next, the surface of the conductive layer 238 as the source signal line of the pixel portion, the surface of the conductive layer 239 as the power supply line of the pixel portion, and the electrode surface of a terminal portion (not shown) are plated. FIG. 7A is a top surface view of a terminal portion immediately after plating is performed and FIG. 7B is a cross sectional view thereof. In FIG. 7B, reference numeral 400 denotes a terminal portion and 401 denotes a terminal. Also, in FIG. 7B, one TFT 303 of the driver circuit portion is typically shown and only a source signal line 238 in the pixel portion is shown. In this embodiment, the plating is performed using a copper plating solution (Microfab Cu2200 produced by EEJA). Upon this plating, as described as one example in the above embodiment, conductors to be plated are connected with each other through a dummy pattern such that they become the same potential. At the time of dividing of a substrate in a later step, electrodes are cut therebetween and the substrate is separated. A short ring may be formed using a dummy pattern.

Next, a first interlayer insulating film 255 covering the source signal line of the pixel portion is formed. An inorganic insulating film containing as a main component silicon is preferably used as the first interlayer insulating film 255.

Further, a second interlayer insulating film 256 made of an organic insulator material is formed on the first interlayer insulating film 255. In this embodiment, an acrylic resin film having a film thickness of 1.6 μm is formed.

Further, a pixel electrode 257 made from a transparent conductive film is formed on the second interlayer insulating film 256 by patterning using a photo mask. For example, ITO (alloy of indium oxide and tin oxide), an alloy of indium oxide and zinc oxide ($In_2O_3$—ZnO), or zinc oxide (ZnO) is preferably used for the transparent conductive film as the pixel electrode 257.

Further, the second interlayer insulating film 256 is selectively etched using a photo mask to form contact holes which reach the respective impurity regions (232, 234, 247, and 249), a contact hole which reaches the source signal line 238 of the pixel portion, and a contact hole which reaches the power supply line 239.

Further, electrodes 257 to 263 for electrically connecting the impurity regions (232, 234, 247, and 249) with the source signal line 238 and the power supply line 239 are formed. Also, a gate signal line 264 are formed.

The pixel electrode 257 is electrically connected with an impurity region 249a of a current control TFT 307 in the pixel portion through an electrode 262 which is in contact with the pixel electrode 247 and overlapped therewith.

The impurity region 234 is electrically connected with the source signal line 238 through an electrode 260. An impurity region 249b is electrically connected with the power supply line 239 through an electrode 263.

In this embodiment, an example in which the electrode 262 is formed after the pixel electrode 247 is formed is indicated. However, after a contact holes and an electrode are formed, a pixel electrode made from a transparent conductive film may be formed to overlap the electrode.

Thus, a driver circuit 301 including a CMOS circuit 302 composed of an n-channel TFT 303 and a p-channel TFT 304 and a pixel portion 305 having a switching TFT 306 made from an n-channel TFT and a current control TFT 307 made from a p-channel TFT can be formed on the same substrate (FIG. 5C). In this embodiment, such a substrate is called an active matrix substrate as a matter of convenience.

Figure 6:
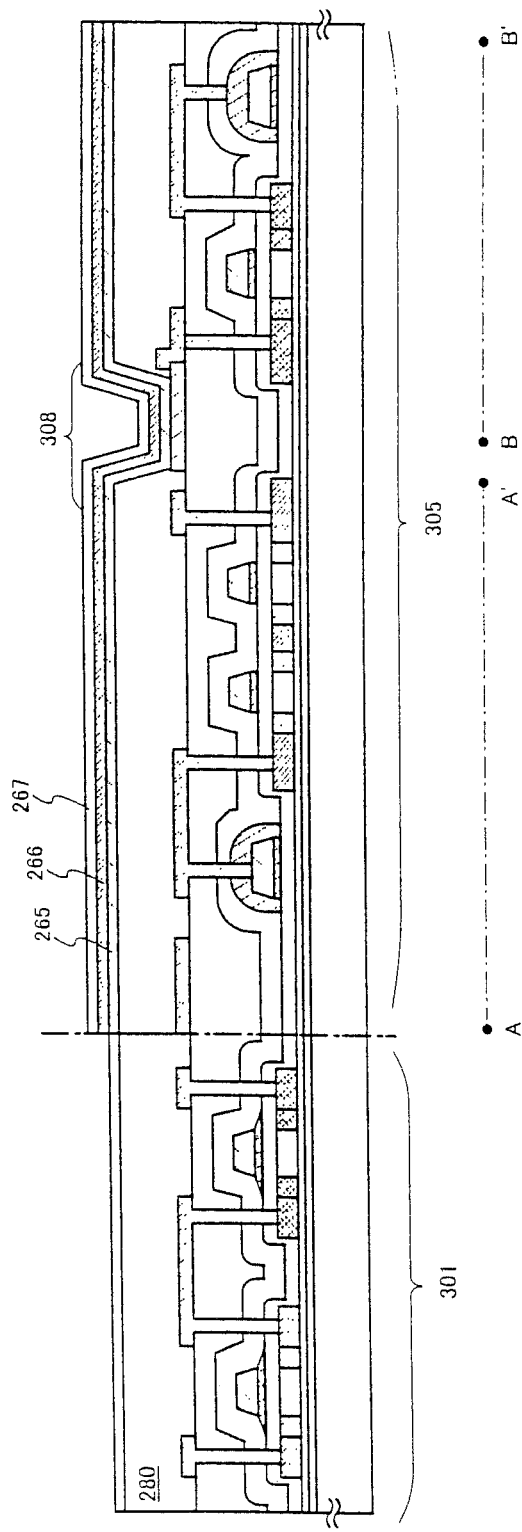
FIG. 6 shows a step of manufacturing the light emitting device according to the present invention.

Next, as shown in FIG. 6, an insulating film including silicon (silicon oxide film in this embodiment) is formed to have a thickness of 500 [nm] and then an opening is formed in a position corresponding to the pixel electrode 257. Thus, a third interlayer insulating film 280 which functions as a bank is formed. When a wet etching method is used at the formation of the opening, side walls having a taper shape can be easily formed. If the side walls having a sufficiently gentle, shape are not formed in the opening, deterioration of an organic compound layer due to a step becomes a remarkable problem. Thus, the attention is required.

Note that, in this embodiment, the film made of silicon oxide is used as the third interlayer insulating film 280. However, an organic resin film made of polyimide, polyamide, acrylic, or BCB (benzocyclobutene) can be used in some cases.

Next, an organic compound layer 265 is formed by an evaporation method and then a cathode (MgAg electrode) 266 is formed by an evaporation method. At this time, it is desirable that thermal treatment is performed for the pixel electrode 257 to completely remove moisture before the organic compound layer 265 and the cathode 266 are formed. Note that, in this embodiment, the MgAg electrode is used as the cathode of a light emitting element. However, it may be made of another known material.

For the organic compound layer 265, a known material in which luminescence is produced by applying an electric field thereto can be used. In this embodiment, an organic compound layer has a two-layers structure made from a hole transporting layer and an emitting layer. However, there is the case where any one of a hole injection layer, an electron injection layer, and an electron transporting layer is further provided in the organic compound layer. Thus, various combination examples are already reported and any structure may be used.

In this embodiment, polyphenylenevinylene is formed as the hole transporting layer by an evaporation method. Also, polyvinylcarbazole to which PBD of 1,3,4-oxadiazole derivative is molecular-dispersed at 30 to 40% is formed as the light emitting layer by an evaporation method and coumarin 6 as a luminescent center of a green color is added thereto at about 1%.

Further, a passivation film 267 is preferably provided. In this embodiment, a silicon nitride film having a thickness of 300 nm is provided as the passivation film 267. The passivation film may be successively formed without being exposed to the air after the formation the cathode 266. The organic compound layer 265 can be further protected from moisture and oxygen by the passivation film 267.

Note that a film thickness of the organic compound layer 265 is preferably set to be 10 to 400 [nm] (typically 60 to 150 [nm]) and a thickness of the cathode 266 is preferably set to be 80 to 200 [nm] (typically 100 to 150 [nm]).

Thus, a light emitting device having a structure as shown in FIG. 6 is completed. Note that, in steps of manufacturing a light emitting device in this embodiment, from a structure of a circuit and a relationship of steps, the source signal line is made from Ta and W as materials for forming the gate electrode and the gate signal line is made from Al as a wiring material for forming a source electrode and a drain electrode. However, different materials may be used.

Figure 8:
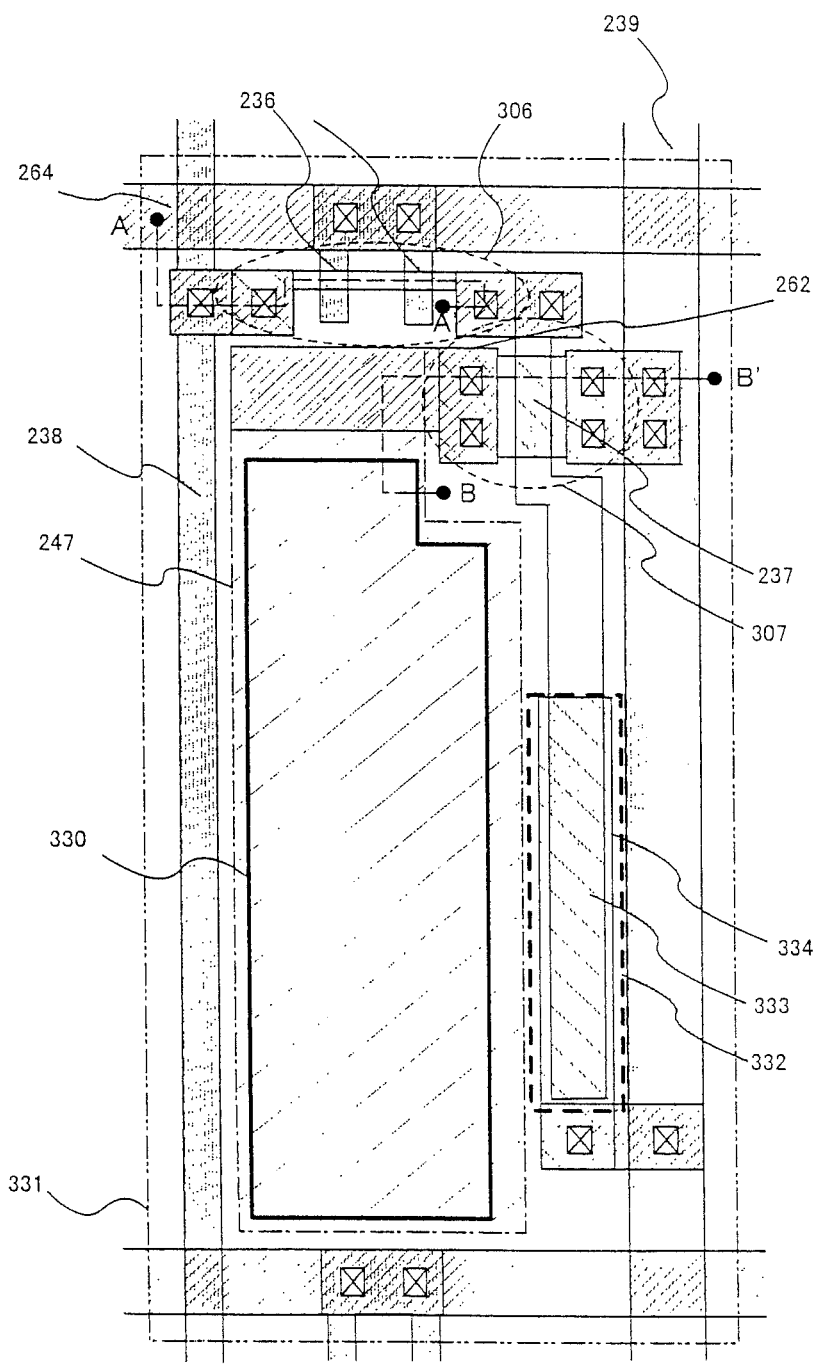
FIG. 8 is a top surface view of a pixel.

A top surface view of a pixel portion of an active matrix substrate manufactured in this embodiment is shown in FIG. 8. Note that the same reference symbols are used for portions corresponding to FIGS. 5A to 5C and 6. A dashed line A-A' shown in FIG. 6 corresponds to a cross sectional view obtained by cutting along a dashed line A-A' shown in FIG. 8. Also, a dashed line B-B' shown in FIG. 6 corresponds to a cross sectional view obtained by cutting along a dashed line B-B' shown in FIG. 8.

A pixel 331 has the source signal line 238 and the gate signal line 264. The drain region of the current control TFT 307 is connected with the pixel electrode 257 through the electrode 262. In an opening 330, the pixel electrode 257 and the organic compound layer are overlapped and a light emitting device 308 emits light. A portion of a gate wiring 333 includes the gate electrode 237 of the current control TFT 307. Reference numeral 334 denotes a capacitor wiring made from a semiconductor layer. A portion 332 in which the capacitor wiring 334 and the gate wiring 333 are overlapped through a gate insulating film interposed therebetween is a capacitor.

Note that, in order to light-shield a gap between pixel electrodes without using a shielding film, an arrangement may be made such that an end portion of the pixel electrode 257 is overlapped with the source signal line 238.

According to steps shown in this embodiment, the number of photo masks required for manufacturing the active matrix substrate can be set to be 5.

Actually, after the structure shown in FIG. 6 is completed, it is preferably packaged (sealed) with a protect film (laminate film, ultraviolet curable resin film, or the like) or a translucent sealing member, which has high hermeticity and less degas, in order to prevent air exposure. In this case, when the inside of the sealing member is made to be an inert atmosphere or a hygroscopic material (for example, barium oxide) is located in the inside, reliability of the light emitting element is improved.

Further, the active matrix substrate and the covering member are sealed with a sealing member or the like to improve the hermeticity. A connector for connecting terminals led from elements or circuits, which are formed on the substrate with external signal terminals (flexible printed circuit: FPC) is attached to complete a product.

Next, the active matrix substrate is divided into a desired shape. Note that this dividing operation may be performed before or after the active matrix substrate and the covering member are sealed with the sealing member. By this dividing operation, the dummy pattern provided for plating is separated.

Figure 9:
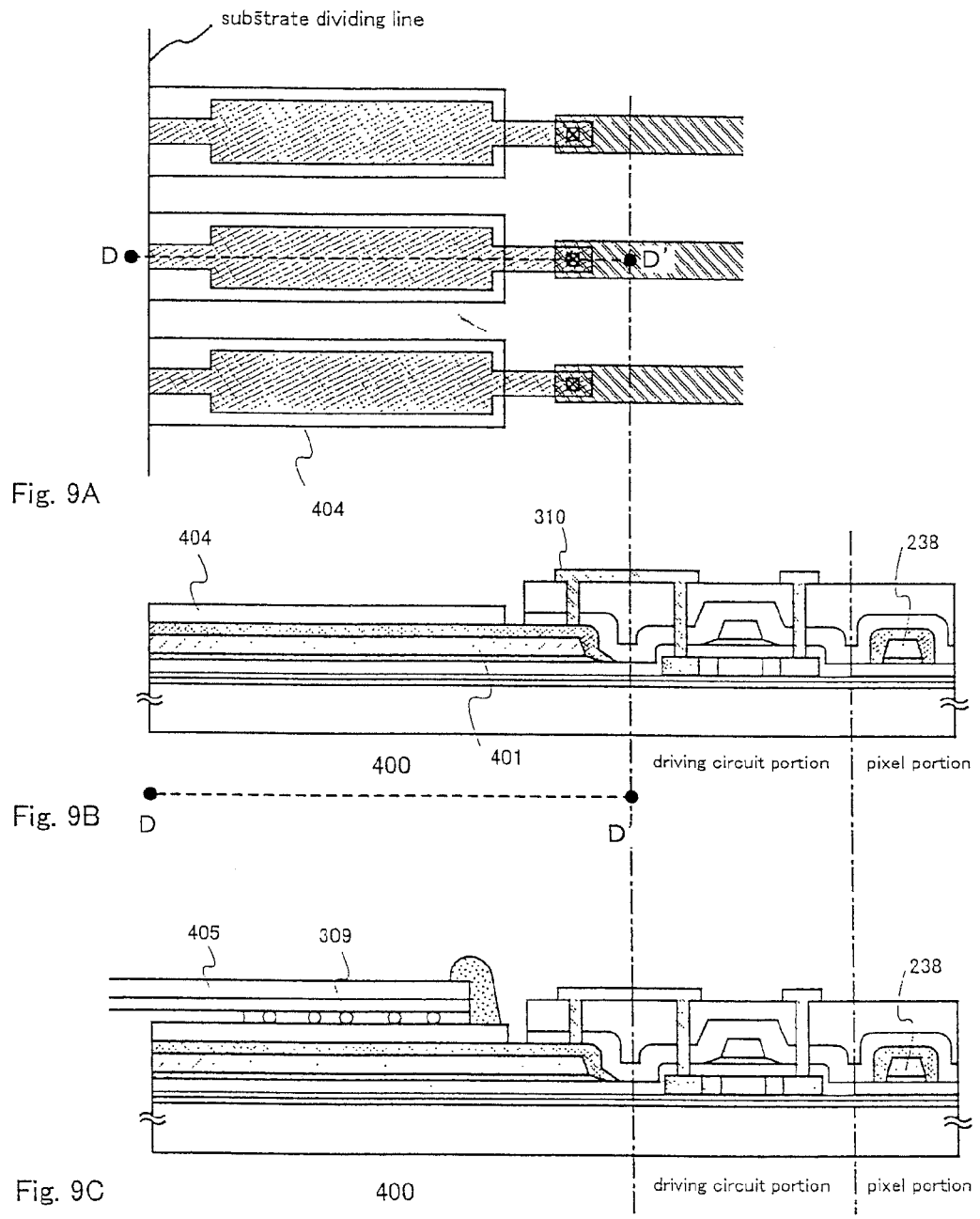
FIGS. 9A to 9C show the terminal portion.

FIG. 9A is a top surface view of a terminal portion after dividing and FIG. 9B is a cross sectional view obtained by cutting, along a dotted line D-D'. In FIGS. 9B and 9c, reference numeral 400 denotes a terminal portion and 401 denotes terminals connected with external terminals. Also, FIGS. 9A to 9C show typically one TFT of the driver circuit portion and only the source signal line 238 in the pixel portion. The terminals 401 are electrically connected with the source signal line 238 and the power supply line 239. In the terminal portion 400, a portion of the plated terminals 401 is exposed and a transparent conductive film 404 made of ITO is formed thereon. Note that the transparent conductive film 404 may be formed simultaneously with the formation of the pixel electrode of the pixel portion.

Further, an FPC is adhered to an exposed portion of the terminals using a known technique. FIG. 9C is a cross sectional view after adhering, of an FPC 405.

Here, the example in which all the driver circuits are formed on the substrate is indicated. However, several ICs may be used for a portion of the driver circuit.

A light emitting device which is thus manufactured can be used as a display portion of various kinds of electronic devices.

Embodiment 2

Figure 10:
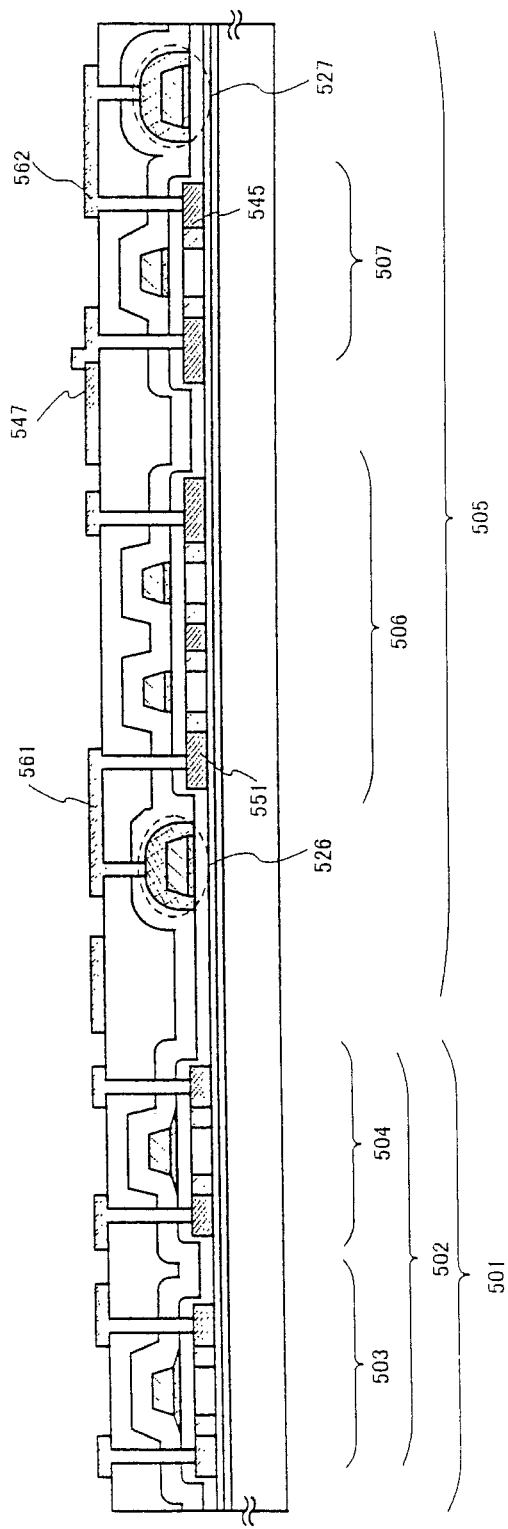
FIG. 10 is a cross sectional view of a light emitting device.

In Embodiment 1, the example in which the CMOS circuit is formed in the driver circuit is indicated. However, an NMOS circuit may be formed using only n-channel TFTs. Note that, when the NMOS circuit is formed by a combination of the n-channel TFTs, there are the case where it is formed using only enhancement TFTs as shown in FIG. 11A (hereinafter referred to as an EDMOS circuit) and the case where it is formed by a combination of an enhancement TFT and a depletion TFT as shown in FIG. 11B (hereinafter referred to as an EDMOS circuit). Also, TFTs provided in the pixel portion may be formed using only the n-channel TFTs. Note that the pixel electrode is preferably a cathode in this case. FIG. 10 is a cross sectional view of a light emitting device of this embodiment. Note that a state after a pixel electrode 547 is formed and before a third interlayer insulating film is formed is shown in FIG. 10.

Reference numeral 501 denotes a driver circuit including TFTs and 505 denotes a pixel portion including TFTs. The pixel portion 505 includes a switching TFT 506 and a current control TFT 507, both of which are an n-channel TFT.

Reference numeral 526 denotes a source signal line after plating and 527 denotes a power supply line after plating. The source signal line 526 is electrically connected with an impurity region 551 of the switching TFT 506 through an electrode 561. The power supply line 527 is electrically connected with an impurity region 545 of the current control TFT 507 through a wiring 562.

The driver circuit 501 includes an nMOS circuit 502 having n-channel TFTs 503 and 504.

The n-channel TFTs 503 and 504 can be separately formed as an enhancement type and a depletion type by adding an element (preferably, phosphorus) which belongs to group 15 of the periodic table or an element (preferably, boron) which belongs to group 13 of the periodic table to semiconductor which is a channel forming region.

When the enhancement type and the depletion type are separately formed, an element (preferably, phosphorus) which belongs to group 15 of the periodic table or an element (preferably, boron) which belongs to group 13 of the periodic table is preferably added to the semiconductor which is the channel forming region, if necessary.

In FIG. 11A, respective reference numerals 31 and 32 denote an enhancement type n-channel TFT (hereinafter referred to as an E-type NTFT). In FIG. 11B, reference numeral 33 denotes an E-type NTFT and 34 denotes a depletion type n-channel TFT (hereinafter referred to as a D-type NTFT).

Note that, in FIGS. 11A and 11B, reference symbol VDH denotes a power source line (positive power source line) to which a positive voltage is applied and reference symbol VDL denotes a power source line (negative power source line) to which a negative voltage is applied. The negative power source line may be used as a power source line with a ground potential (ground power source line).

An example in which a shift register is manufactured using the EEMOS circuit shown in FIG. 11A or the EDMOS circuit shown in FIG. 11B is shown in FIGS. 12A and 12B. In FIGS. 12A and 12B, reference numerals 40 and 41 each denote a flip-flop circuit. Also, reference numerals 42 and 43 each denote an E-type NTFT. A clock signal (CL) is inputted to the gate of the E-type NTFT 42. A clock signal (CL bar) having inverted polarity is inputted to the gate of the E-type NTFT 43. Reference numeral 44 denotes an inverter circuit. As shown in FIG. 12B, the EEMOS circuit shown in FIG. 11A or the EDMOS circuit shown in FIG. 11B is used as the inverter circuit. Thus, the driver circuit of a display device can be composed of only n-channel TFTs.

When the driver circuit in a display device having a small display area is manufactured using the NMOS circuit composed of the n-channel TFTs, consumption power is increased as compared with that of a CMOS circuit. However, the present invention is particularly effective in the case of a large display area. Thus, a problem with respect to the consumption power is not caused in the case of a stationary monitor or a television, which has a large display area. Also, there is no problem in the case where the driver circuit in a gate side is manufactured using only the NMOS circuits. However, the driver circuit in a source side is desirably manufactured using an external IC or the like in part rather than using only the NMOS circuits because high speed drive can be realized.

Note that this embodiment can be embodied by being freely combined with Embodiment 1.

Embodiment 3

In this embodiment, a dummy pattern in the case where a source signal line included in a pixel portion, a power supply line included in the pixel portion, and a terminal are connected with the same plating electrode and electroplating is performed will be described.

Figure 13:
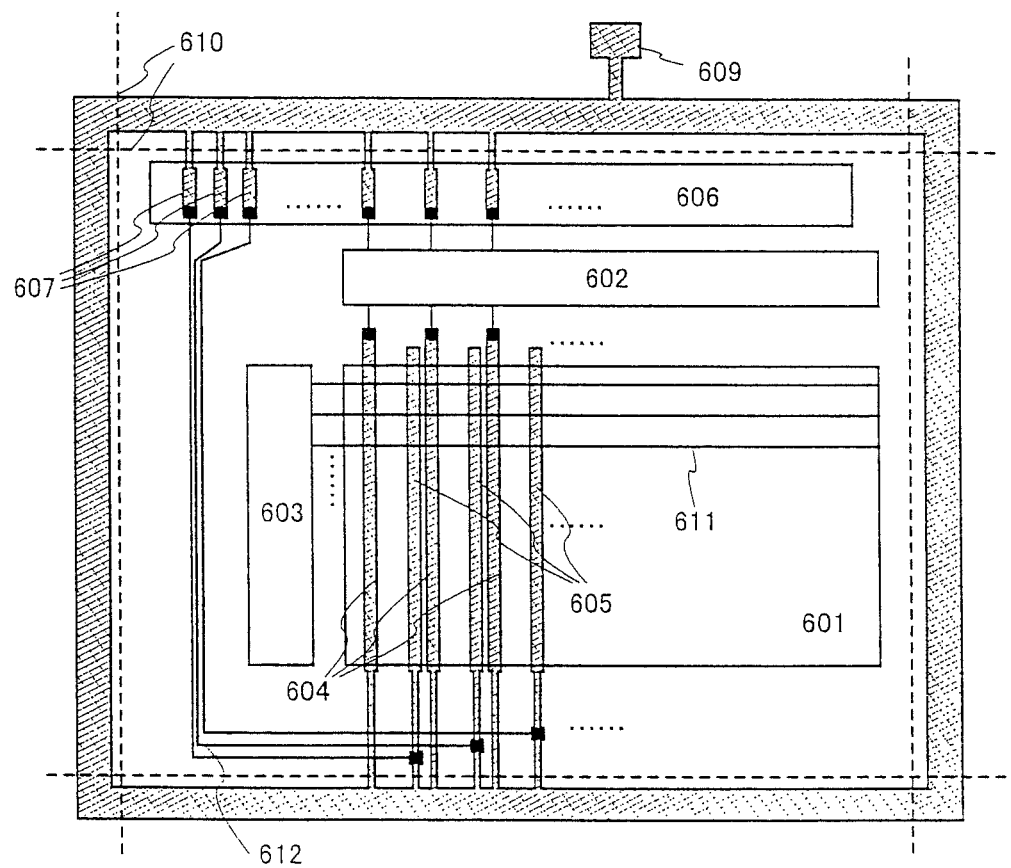
FIG. 13 is a top surface view of a light emitting device after plating.

FIG. 13 is a top surface view of a light emitting device of this embodiment. Note that three source signal lines 604 in the pixel portion and three power supply lines 605 are typically shown in FIG. 13. The source signal lines 604 in the pixel portion are in parallel with one another and have a belt shape. The power supply lines 605 in the pixel portion are in parallel with one another and have a belt shape. Six terminals 607 are typically shown.

Reference numeral 601 denotes a pixel portion. The source signal lines 604 before plating and the power supply lines 605 before plating are provided in the pixel portion 601. The plurality of (six) terminals 607 before plating are formed in a terminal portion 606.

The source signal lines 604, the power supply lines 605, and the terminals 607 are all connected with a plating electrode 609.

In this embodiment, a source side driver circuit 602 and a gate side driver circuit 603 are formed on the same substrate as in the case of the pixel portion 601. However, the source side driver circuit 602 and the gate side driver circuit 603 are not necessarily formed on the same substrate as the pixel portion 601. Note that, in FIG. 13, the source side driver circuit 602 and the gate side driver circuit 603 are in a state before an electroplating method is performed.

Reference numeral 610 denotes substrate dividing lines. When a substrate is divided along the substrate dividing lines 610 after the plating, the source signal lines 604, the power supply lines 605, and the terminals 607 are separated from the plating electrode 609.

After the plating, an interlayer insulating film is formed and wirings (lead wirings) for connecting the impurity regions of the semiconductor layers or the power supply lines with the terminals and the gate signal lines are formed. In the present invention, the gate signal lines are electrically connected with the gate electrodes through contact holes provided in the interlayer insulating film. In FIG. 13, reference numeral 612 denotes the lead wirings and 611 denotes the gate signal lines.

The source signal lines 604 in the pixel portion are electrically connected with the source side driver circuit 602 through wirings. The power supply lines 605 and the terminals 607 are electrically connected with one another through the lead wirings 612. The source side driver circuit 602 and the terminal 607 are electrically connected with one another through the lead wirings 612.

After the plating, the substrate is divided along the substrate dividing lines 610 to separate the source signal lines 604, the power supply lines 605, and the terminals 607 from the plating electrode 609.

Thus, according to the present invention, the source signal lines in the pixel portion, the power supply lines in the pixel portion, and the terminals are covered with the metal material having a low resistance. Therefore, even if the pixel portion has a large area, high speed drive can be sufficiently realized.

In particular, when the resistance of the power supply lines is reduced, a potential drop of the power supply lines by a wiring resistance is prevented and thus crosstalk can be prevented.

This embodiment can be embodied by being freely combined with Embodiment 1 or 2.

Embodiment 4

In this embodiment, an example in which a source signal line is made of the same material as a gate electrode and a power supply line is made of the same material as a gate signal line will be described.

Figure 14:
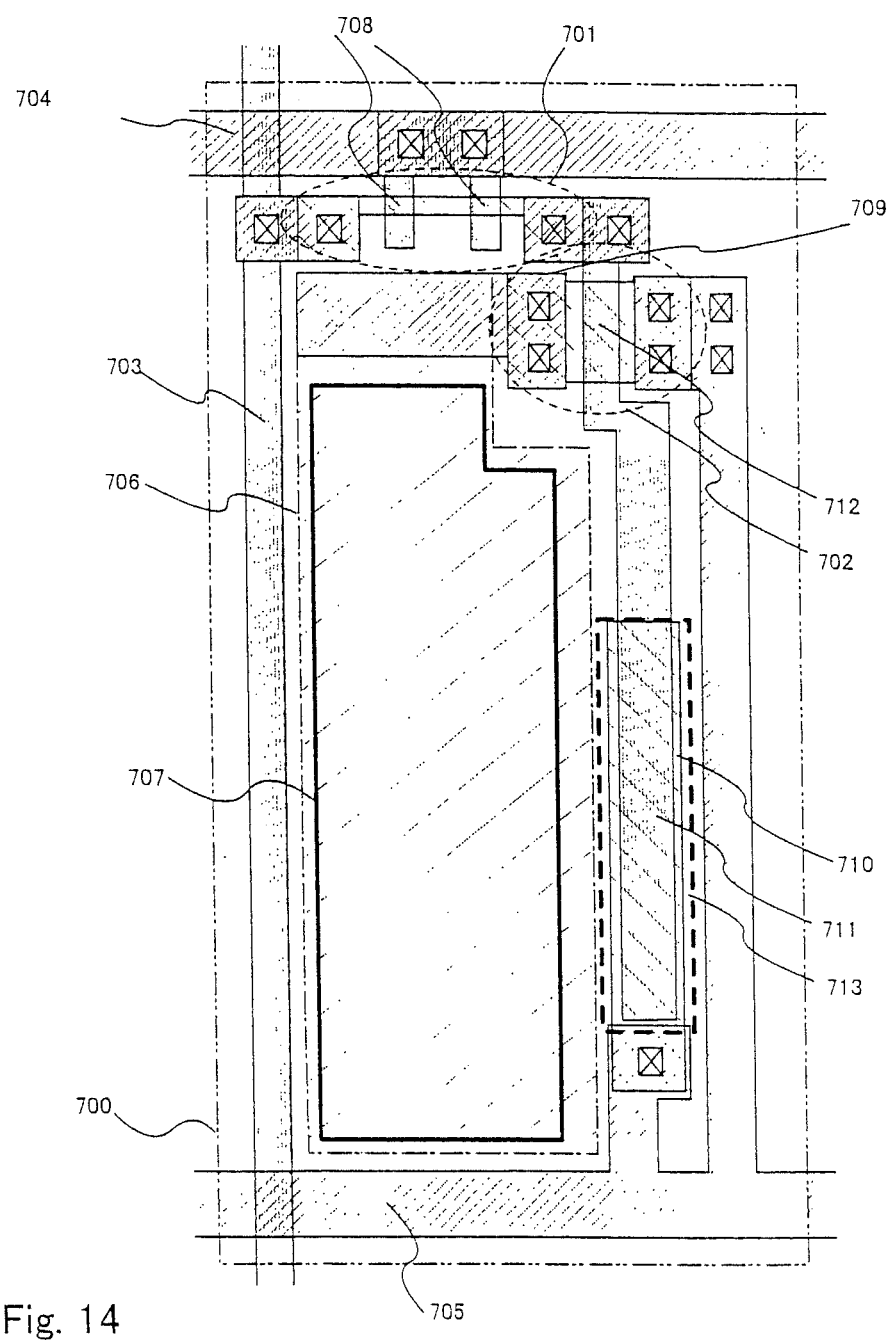
FIG. 14 is a top surface view of a pixel.

A top surface view of a pixel in this embodiment is shown in FIG. 14. In this embodiment, a region including a source signal line 703, a gate signal line 704, and a power supply line 705 corresponds to a pixel 700. The pixel 700 has a switching TFT 701 and a current control TFT 702.

A gate wiring 711 includes a gate electrode 712 of the current control TFT 702. The source signal line 703, a gate electrode 708 of the switching TFT 701, the gate electrode 712 of the current control TFT 702, and the gate wiring 711 are made from the same conductive film.

The drain region of the current control TFT 702 is connected with a pixel electrode 706 through an electrode 709. A third interlayer insulating film (not shown) is formed on the pixel electrode 706 and an organic compound layer (not shown) is formed on the third interlayer insulating film. The pixel electrode 706 and the organic compound layer are in contact with each other through an opening 707 provided in the third interlayer insulating film.

The electrode 709, the power supply line 705, the gate signal line 704, wirings directly connected with the source region and the drain region of the switching TFT 701, and wirings directly connected with the source region and the drain region of the current control TFT 702 are made from the same conductive film.

The gate wiring 711 includes the gate electrode 712 of the current control TFT 702. Reference numeral 710 denotes a capacitor wiring made from a semiconductor layer. A portion 713 in which the capacitor wiring 710 and the gate wiring 711 are overlapped through a gate insulating film (not shown) interposed therebetween is a capacitor.

Note that, in order to light-shield a gap between pixel electrodes without using a shielding film, an arrangement may be made such that an end portion of the pixel electrode 706 is overlapped with the source signal line 703.

This embodiment can be embodied by being freely combined with Embodiment 3.

Embodiment 5

In this embodiment, an example in which a source signal line or a power supply line is formed by steps different from Embodiment 1 is shown in FIGS. 15A to 15C.

FIG. 15A shows an example in which a source signal line 903 or a power supply line (not shown) in a pixel portion is plated, an interlayer insulating film is formed, contact holes are formed in the interlayer insulating film, and then a terminal portion 900 is plated.

A terminal 901 and the source signal line 903 or the power supply line are formed in the same step as a gate electrode 902 of a TFT. First, only the source signal line 903 or only the power supply line in the pixel portion is selectively plated. After that, an interlayer insulating film is formed and then contact holes are formed therein. At the formation of the contact holes, a portion of the terminal 901 in the terminal portion 900 is exposed. Next, only an exposed region of the terminal 901 in the terminal portion is plated to form a coating 904. Note that the coating 904 is included in the terminal 901.

After that, electrodes connected with lead wirings and impurity regions of a semiconductor layer are formed. Later steps are performed according to Embodiment 1 and thus a structure shown in FIG. 15A is preferably obtained.

Note that activation of the impurity element included in the semiconductor layer is preferably performed before the formation of the coating 904.

As the case of Embodiment 1, at plating, electrodes or wirings, which are to be plated are connected with each other through a dummy pattern such that they become the same potential. At the time of dividing a substrate in a later step, electrodes are cut therebetween and the substrate is separated. Further, a short ring may be formed using a dummy pattern.

FIG. 15B shows an example in which plating is performed by steps different from those in FIG. 15A. This embodiment is an example in which a source signal line 913 is not formed simultaneously with the formation of a gate electrode 912 of a TFT.

After an insulating film for protecting the gate electrode 912 is formed, the impurity element added to respective semiconductor layers is activated. Then, the source signal line 913 in the pixel portion and the terminal 911, which are made of a metal material having a low resistance (typically, a material containing mainly aluminum, silver, and copper), are simultaneously formed on the insulating film by a photolithography step. Thus, according to the present invention, the source signal line in the pixel portion is made of the metal material having the low resistance. Thus, even if the area of the pixel portion becomes larger, it can be sufficiently driven. Also, in order to decrease the number of masks, the source signal lines may be formed by a printing method.

Then, plating (electroplating method) is performed to form a metal film on the surface of the source signal line 913 in the pixel portion and the surface of the terminals 911. Later steps are performed according to Embodiment 1 and thus a structure shown in FIG. 15B is preferably obtained.

FIG. 15C shows an example in which the source signal line is formed by steps different from those in FIG. 15A.

In this embodiment, the source signal line is formed by a printing method. A conductive layer is provided to improve position precision of the source signal line in a pixel.

In this embodiment, conductive layers 915a and 915b composing the source signal line are formed by the same step as in the case of the gate electrode. Then, the impurity element is activated without covering the gate electrode with an insulating film. The activation is performed by, for example, thermal annealing, in an inert atmosphere at a reduced pressure to suppress an increase of resistance by oxidation of the conductive layers. Then. the source signal line is formed using a printing method so as to fill a gap between the conductive layers. When a conductive layer is provided along the source signal line, a break easy to be caused in the printing method (screen printing) can be prevented. Later steps are performed according to Embodiment 1 and thus a structure shown in FIG. 15C is preferably obtained.

The screen printing is to use as a mask a plate having an opening with a desired pattern, form a paste (diluent) or an ink, into which for example, a metal particle (Ag, Al, or the like) is mixed on a substrate which is a body to be printed through the opening, and then form a wiring with a desired pattern by thermal firing. Such a printing method is relatively low in cost and can be used in the case of a large area and thus suitable to the present invention.

Also, instead of the screen printing method, an intaglio printing method using a drum to be rotated, an intaglio printing method, and various offset printing methods can be applied to the present invention.

The source signal line in the pixel portion can be formed by the above various methods.

Note that this embodiment can be freely combined with any one of Embodiments 1 to 4.

Embodiment 6

Figure 16:
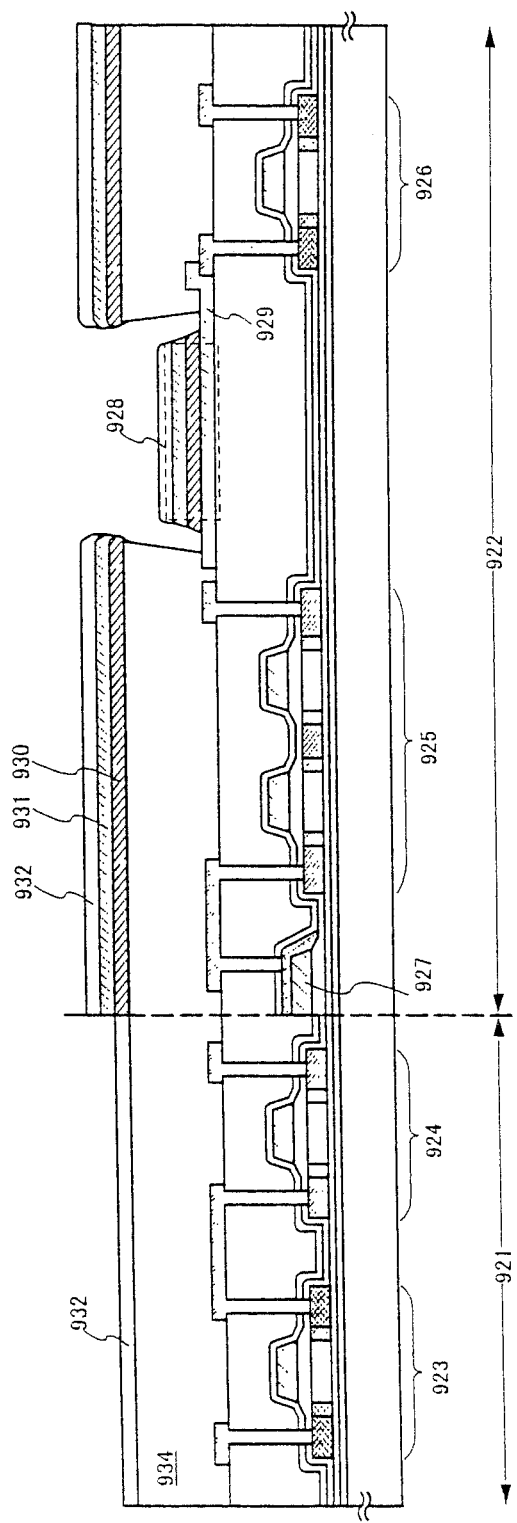
FIG. 16 is a cross sectional view of a light emitting device.

In this embodiment, a light emitting device having a structure different from that indicated in Embodiment 1 will be described using. FIG. 16.

In a driver circuit 921, a p-channel TFT 923 and an n-channel TFT 924 are formed and thus a CMOS circuit is completed.

In a pixel portion 922, a switching TFT 925 and a current control TFT 926 are formed. One of the source region and the drain region in the switching TFT 925 is electrically connected with a source signal line 927. Also, although not shown, the other is electrically connected with the gate electrode of the current control TFT 926.

One of the source region and the drain region in the current control TFT 926 is connected with a power supply line (not shown). Also, the other is connected with a pixel electrode 929 included in a light emitting element 928.

The light emitting element 928 includes the pixel electrode 929, an organic compound layer 930 which is in contact with the pixel electrode 929, and a counter electrode 931 which is in contact with the organic compound layer 930. Note that, in this embodiment, a protective film 932 covering the driver circuit 921 and the pixel portion 922 is provided on the counter electrode 931.

In this embodiment, as shown in FIG. 16, a third interlayer insulating film 934 having an opening portion is formed in a position corresponding to the pixel electrode 929. The third interlayer insulating film 934 has an insulation property, serves as a bank, and has a function for dividing the respective organic compound layer of adjacent pixels. In this embodiment, the third interlayer insulating film 934 is made of a resist.

In this embodiment, a thickness of the third interlayer insulating film 934 is set to be about 1 μm. The opening portion is formed such that it is expanded with approaching the pixel electrode 929, that is, such that it becomes a so-called inverse taper shape. This is formed as follows. First, after a resist is formed, a region except a region in which the opening portion is to be formed is covered with a mask. Next. UV light is irradiated to expose it and then the exposed region is removed by a developer.

As described in this embodiment, when the third interlayer insulating film 934 is formed in an inverse taper shape, the organic compound layer is divided among the adjacent pixels at the formation of the organic compound layer in a later step. Thus, even if the thermal expansion coefficient of the organic compound layer is different from that of the third interlayer insulating film 934, cracking and peeling of the organic compound layer can be suppressed.

Note that, in this embodiment, a film made of a resist is used as the third interlayer insulating film. However, polyimide, polyamide, acrylic, BCB (benzocyclobutene), a silicon oxide film, or the like can be used in some cases. If the third interlayer insulating film 934 is a substance having an insulation property, an organic matter or an inorganic matter may be used.

Although not shown in FIG. 16, the power supply line is also formed in the same layer as in the case of the gate electrode and then plated. Thus, a wiring resistance may be reduced.

This embodiment can be embodied by being freely combined with Embodiments 1 to 5.

Embodiment 7

Figure 17:
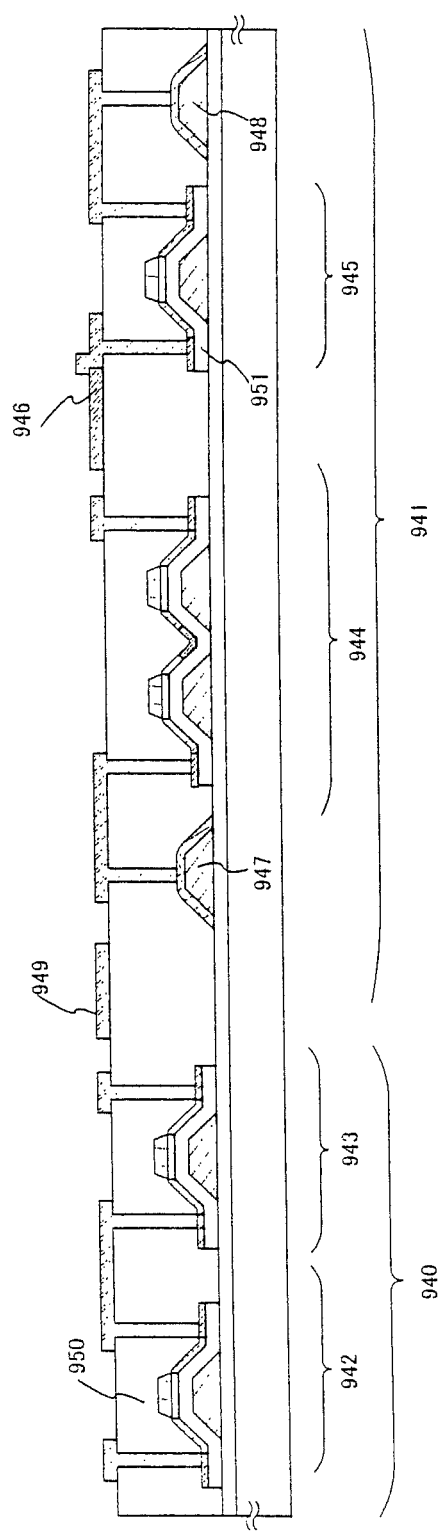
FIG. 17 is a cross sectional view of a light emitting device.

In this embodiment, a structure of a light emitting device having an inverse stagger TFT will be described. FIG. 17 is a cross sectional view of a light emitting device of this embodiment. Note that FIG. 17 shows a state after a pixel electrode is formed and before a third interlayer insulating film is formed.

In the light emitting device of this embodiment, a driver circuit 940 includes an n-channel TFT 942 and a p-channel TFT 943, which compose a CMOS circuit.

A pixel portion 941 includes a switching TFT 944 and a current control TFT 945. Reference numeral 947 denotes a source signal line, 948 denotes a power supply line, and 949 denotes a gate signal line.

One of the source region and the drain region in the switching TFT 944 is connected with the source signal line 947. Also, although not shown, the other is connected with the gate electrode of the current control TFT 945.

One of the source region and the drain region in the current control TFT 945 is electrically connected with the power supply line 948. Also, the other is electrically connected with a pixel electrode 946.

The gate signal line 949 is formed on a second interlayer insulating film 950. Although not shown, the gate signal line 949 is connected with the gate electrode of the switching TFT 944.

The source signal line 947 and the power supply line 948 are formed in the same layer as in the case of the gate electrode of the TFT and then plated to reduce a wiring resistance. Note that, in this embodiment, a portion of a gate insulating film 951 is removed by etching before plating (electroplating method) to expose the surface of the source signal line 947 and the surface of the power supply line 948 in the pixel portion, and then a metal film is formed on these surfaces by an electroplating method.

This embodiment can be embodied by being freely combined with Embodiments 1 to 6.

Embodiment 8

Figure 18:
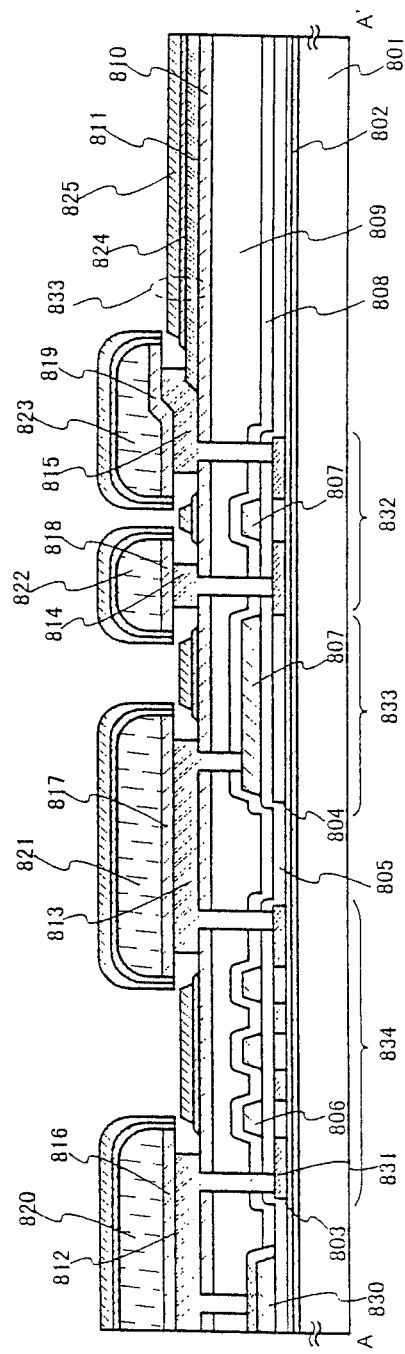
FIG. 18 is a cross sectional view of a light emitting device.

In this embodiment, a light emitting device having a structure different from Embodiment 1 will be described. FIG. 18 is a cross sectional view of a pixel portion in a light emitting device of this embodiment.

FIG. 18 shows a state in which a switching TFT 834, a capacitor 833, and a current control TFT 832 are formed. A glass substrate or an organic resin substrate is used as a substrate 801 which becomes a base for forming those elements. An organic resin material is lightweight as compared with a glass material and thus effective for weight reduction of a light emitting device itself. When the light emitting device is manufactured, an organic resin material such as polyimide, polyethylene terephthalate (PET), polyethylene naphthalate (PEN), polyether sulfone (PES), or aramid can be used. Barium borosilicate glass or aluminoborosilicate glass, which is called no alkali glass is desirably used for the glass substrate. The glass substrate having a thickness of 0.5 to 1.1 mm is used. However, for the weight reduction, it is required that the thickness is thinned. Also, for further weight reduction, a glass substrate having a small specific gravity of 2.37 g/cc is desirably used.

A first insulating film 802 for the prevention of impurity diffusion from the substrate and the stress control is formed on the substrate 801. This is made from an insulating film including silicon. For example, this is obtained by forming a silicon oxynitride film from $SiH_4$, $NH_3$, and $N_2O$ to have a thickness of 20 to 100 nm using a plasma CVD method. With respect to the composition, a nitrogen concentration is set to be 20 to 30 atoms % and an oxygen concentration is set to be 20 to 30 atoms %, and thus tensile stress is provided. Preferably, an insulating film made from a silicon oxynitride film formed from $SiH_4$ and $N_2O$ is further formed in the upper layer of the first insulating film. With respect to the composition of this insulating film, a nitrogen concentration is set to be 1 to 20 atom % and an oxygen concentration is set to be 55 to 65 atom %, and thus the nitrogen concentration is decreased and internal stress is reduced.

Semiconductor films 803 and 804 are made from a silicon film having a crystalline structure. A typical example is a semiconductor film formed by laser light irradiation or thermal treatment for an amorphous silicon film formed by a plasma CVD method. Its thickness is set to be 20 to 60 nm. A second insulating film 805 which is a gate insulating film and gate electrodes 806 and 807 are formed in the upper layer. The gate electrode 807 is connected with one electrode of the capacitor 833.

A third insulating layer 808 made of silicon nitride produced from $SiH_4$, $NH_3$, and $N_2$, or silicon oxynitride produced from $SiH_4$, $NH_3$, and $N_2O$ is formed in the upper layer of the gate electrode and used as a protective film. Further, a fourth insulating film 809 made of an organic resin material such as polyimide or acrylic is formed as a planarization film.

A fifth insulating film 810 made of an inorganic insulating material such as silicon nitride is formed on the fourth insulating film made of an organic resin material. The organic resin material has hygroscopicity, a property for occluding moisture. If the moisture is again emitted, oxygen is supplied to an organic compound and this causes deterioration of a light emitting element. Thus, in order to prevent occlusion and reemission of the moisture, the fifth insulating film 810 made of silicon oxynitride produced from $SiH_4$, $NH_3$, and $N_2O$ or silicon nitride produced from $SiH_4$, $NH_3$, and $N_2$ is formed on the fourth insulating film 809. Alternatively, the fourth insulating film 809 is omitted and only one layer of the fifth insulating film 810 can be used as a substitute.

After that, contact holes which reach the source or the drain region in the respective semiconductor films are formed. A transparent conductive film made of ITO (indium tin oxide), zinc oxide, or the like is formed to have a thickness of 110 nm by a sputtering method and then etched into a desired shape (shape as shown in FIG. 8) to form an anode 811 which is one electrode of a light emitting element 833.

Electrodes 812 to 815 have a laminate structure of titanium and aluminum and are formed into a total thickness of 300 to 500 nm and produce contacts to the semiconductor films. The electrode 815 is formed to overlap the anode 811.

Reference numeral 830 denotes a source signal line connected with an impurity region 831 included in the semiconductor layer 803 through the electrode 812. The surface of the source signal line 830 is plated to reduce the make resistance.

Insulating films 816 to 819 formed on these electrodes are made of silicon nitride or the like and these end portions are formed so as to position outside of the electrodes. Such a structure is obtained by the following steps. A layer of a conductive film for forming the electrodes and an insulating film are laminated and etched according to a pattern of resists 820 to 823. After that, only the conductive film is etched with leaving the resist pattern, and thus canopies as shown in FIG. 18 can be formed. Therefore, the insulating films 816 to 819 are not necessarily limited to an insulating film. If a material has an etching selection ratio to a conductive film for forming wirings, such a material can be applied to the insulating films.

An organic compound layer 824 and a cathode 825 are formed by an evaporation method. Thus, the canopies formed here become masks and the organic compound layer 824 and the cathode 825 can be formed on the anode 811 in a self alignment. The resists 820 to 823 may be left on the insulating films 816 to 819 or may be removed.

Wet processing (processing such as etching using a chemical solution or water washing) can not be performed for the organic compound layer 824 and the cathode 825. Thus, it is required that a partition wall layer made of an insulating material is provided according to the anode 811 to make insulation isolation between adjacent elements. However, when the pixel structure of this embodiment is used, the wirings and the insulating films formed thereon can be used as a substitute for the partition wall layer.

Thus, the light emitting device 833 is composed of the anode 811 made of a transparent conductive material such as ITO, the organic compound layer 824 including a hole injection layer, a hole transporting layer, an emitting layer, and the like, and the cathode 825 made of a material such as alkaline metal or alkaline earth metal, such as MgAg or LiF.

Thus, there is no case where stress is applied from members formed in the peripheral to the light emitting element. Therefore, the deterioration of the light emitting element by thermal stress or the like can be prevented. As a result, a light emitting device having higher reliability can be manufactured.

Embodiment 9

Figure 19:
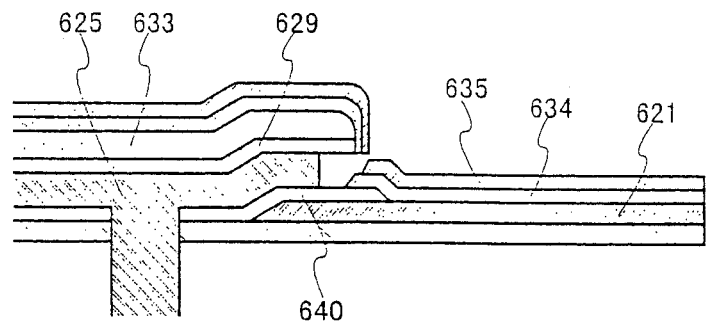
FIG. 19 is a cross sectional view of a light emitting element.

In this embodiment, another structure of the light emitting device described in Embodiment 8 using FIG. 18 will be described using FIG. 19. A seventh insulating film is formed after an anode 621 is formed. This insulating film is made of silicon oxide, silicon nitride, or the like. After that, the seventh insulating film on the anode 621 is removed by etching. At this time, as shown in FIG. 19, an end portion of the anode 621 is overlapped with the seventh insulating film. Thus, a patterned seventh insulating film 640 is obtained.

Later steps are similarly performed and a connection electrode 625, an insulating film 629, and the like are formed. An organic compound layer 634 and a cathode 635 are formed as shown in FIG. 19. When the seventh insulating film 640 is provided, it can be prevented that the cathode 635 is in contact with the anode 621 in the end portion and thus a short circuit is caused.

According to the pixel structure indicated in this embodiment, the deterioration of the light emitting element by thermal stress can be prevented and a light emitting device having higher reliability can be manufactured.

Embodiment 10

In this embodiment, a state of the connection between a lead wiring on a substrate and a terminal will be described.

Figure 20A:
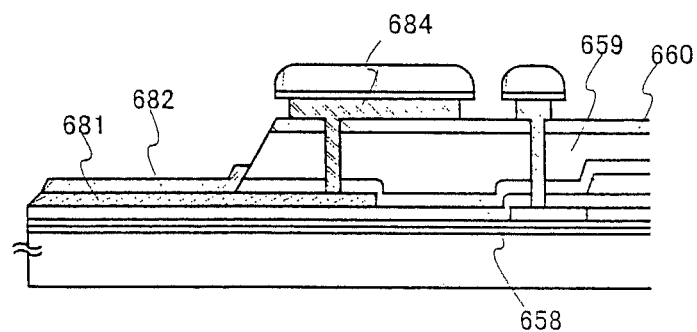
FIGS. 20A and 20B are cross sectional views of a connection between a terminal and a lead wiring and a connection between a counter electrode and the lead wiring.

In a terminal portion, as shown in FIG. 20A, a terminal 681 is made of the same material as a gate electrode. The terminal 681 is plated to make resistance reduction state.

A third insulating film 658, a fourth insulating film 659, and a fifth insulating film 660, which are formed in the upper layer of the terminal are removed simultaneously when contact holes are formed by etching and thus the surface can be exposed. When a transparent conductive film 682 is laminated on the terminal 681, the connection to an FPC can be made.

Figure 20B:
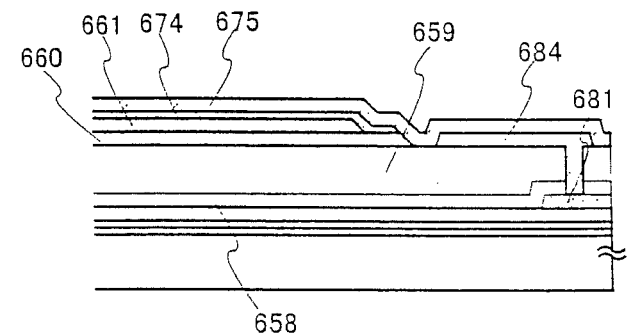

Since the counter electrode of the light emitting element becomes a common electrode, the connection is made outside of the pixel portion. In order to control a potential from the outside, the counter electrode is connected with the terminal through the lead wiring on the substrate. FIG. 20B shows one example of a connection structure between the lead wiring and the counter electrode.

A lead wiring 684 is in contact with the fourth insulating film 659 and formed in the same layer as in the case of a gate signal line. The fifth insulating film 660 formed in the upper layer of the lead wiring are removed simultaneously with forming contact holes by etching to expose the surface.

A pixel electrode 661 is formed on the fifth insulating film 660 and an organic compound layer 674 is formed in contact with the pixel electrode 661. A counter electrode 675 is formed to cover the organic compound layer 674 and the lead wiring 684. The contact between the lead wiring 684 and the counter electrode 675 is made. Note that the counter electrode 675 is not in contact with the pixel electrode 661.

The lead wiring 684 is connected with the terminal 681 through a contact hole formed in the third insulating film 658 and the fourth insulating film 659.

The organic compound layer 674 is formed by an evaporation method. However, if the processing is performed, the organic compound layer is formed on the entire surface of the substrate. Thus, it is formed according to a region of the pixel portion using a shadow mask such as a metal mask or a ceramic mask. Similarly, the counter electrode (cathode) 675 is formed. Note that a mask size is changed such that the cathode is formed in a region including an outer region of the pixel portion. When such processing is performed, the structure shown in FIG. 20B can be obtained.

Embodiment 11

FIG. 21 shows an appearance of a light emitting device and indicates a state in which a pixel portion 722, a gate side driver circuit 724, a source side driver circuit 723, and terminals 726 are formed in a substrate 721. The terminals 726 are connected with the respective driver circuits through lead wirings 725. In the pixel portion 722, wirings 728 which also serve as partition wall layers are formed in an extended direction of signal lines to which image signals are inputted. Although these wirings 728 include source signal lines and power supply lines, the details are omitted here. Of the wirings 728, the power supply lines are connected with the terminals 726 through lead wirings 733.

Lead wiring 727 are to connect between the counter electrode and the terminals. The connection method is already described in Embodiment 10.

If necessary, an IC chip in which a memory and the like are formed may be mounted in an element substrate by a COG (chip on glass) method or the like.

Light emitting elements are formed between the wirings 728 and the structure is shown in FIG. 22. Pixel electrodes 730 correspond to respective pixels and are formed between the wirings 728. Organic compound layers 731 are formed between the wirings 728 in the upper layer of the pixel electrodes. Also, the organic compound layers 731 are continuously formed in a stripe shape on the plurality of pixel electrodes 730.

A counter electrode 732 is formed in the upper layer of the organic compound layers 731. Similarly, the counter electrode 732 is formed between the wirings 728 in a stripe shape. Further, the connection with the counter electrode 732 is made in a region in which is not sandwiched by the wirings 728, that is, an outer region of the pixel portion 722. A connection portion may be formed in one end portion of the counter electrode or both end portions thereof.

The lead wirings 727 are formed in the same layer as in the case of the gate signal lines (not shown) and not in directly contact with the wirings 728. The contact between the lead wirings 727 and the counter electrode 732 is made in the overlapped portion.

A light emitting element is defined by an overlapped region among the pixel electrode 730, the organic compound layer 731, and the counter electrode 732. In an active matrix light emitting device, each of the pixel electrodes 730 are connected with respective active elements. If the counter electrode has a defect and thus a defect is caused in the inner portion of the pixel portion, there is the fear that the defect is recognized as a line defect. However, as shown in FIG. 22, when the structure such as the connection with both ends of the counter electrode is made and the counter electrode is used as a common electrode is obtained, the fear of occurrence of such a line defect can be reduced.

Embodiment 12

In this embodiment, an example in which PPTA (plural pulse thermal annealing) is performed as thermal treatment in Embodiment 1 is indicated.

The PPTA is thermal treatment in which a cycle of heating using a light source (halogen lamp, metal halide lamp, high pressure mercury lamp, high pressure sodium lamp, xenon lamp, or the like) and cooling by circulation of a refrigerant (nitrogen, helium, argon, krypton, xenon, or the like) to a processing chamber is repeated plural times. A light emitting time per shot in the light source is 0.1 to 60 seconds, preferably, 0.1 to 20 seconds. Light is irradiated plural times. Note that the light source is turned on in a pulse shape by a power source and a control circuit such that a retaining period in the semiconductor film becomes 0.5 to 5 seconds.

When an actual heating time is shortened and light which is selectively absorbed by the semiconductor film is irradiated from light source(s) provided in one surface side or both surface sides by the PPTA, the substrate itself is not greatly heated and only the semiconductor film is selectively heated (at a temperature rise rate of 100 to 200° C./second). In order to suppress a temperature rise of a substrate, cooling is performed using a refrigerant from the external (at a temperature fall rate of 50 to 150° C./second).

An example in which the thermal treatment in Embodiment 1 is performed for the activation is indicated below.

The PPTA is performed in the activation step shown in FIG. 5A. Pulse light is irradiated from one surface side or both surface sides of the substrate using a tungsten halogen lamp as a light source. At this time, a flow rate of He is changed in synchronization with blinking of the tungsten halogen lamp and thus the semiconductor film is selectively heated.

By the PPTA, an impurity element is activated and a metal element which is included in the semiconductor film and used for crystallization can be gettered from the channel forming region to the impurity regions. Note that, if not only phosphorus but also an impurity element imparting a p-type are added to the impurity regions, it is further effective. Thus, a step of adding boron imparting a p-type to the impurity regions after the first doping is preferably added. Also, a processing chamber for the PPTA may be prepared in a reduced pressure state of 13.3 Pa or lower to prevent oxidation and contamination.

Note that this embodiment can be freely combined with any one of Embodiments 1 to 11.

Embodiment 13

In this embodiment, detail structures of a source side driver circuit and a gate side driver circuit, which are included in a driver circuit of the light emitting device of the present invention will be described.

Figure 23A:
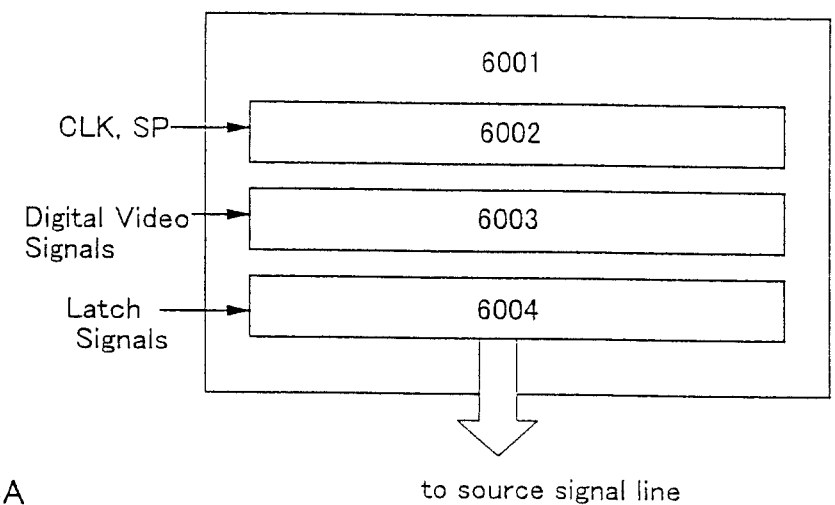
FIGS. 23A and 23B are block diagrams of driver circuits.
Figure 23B:
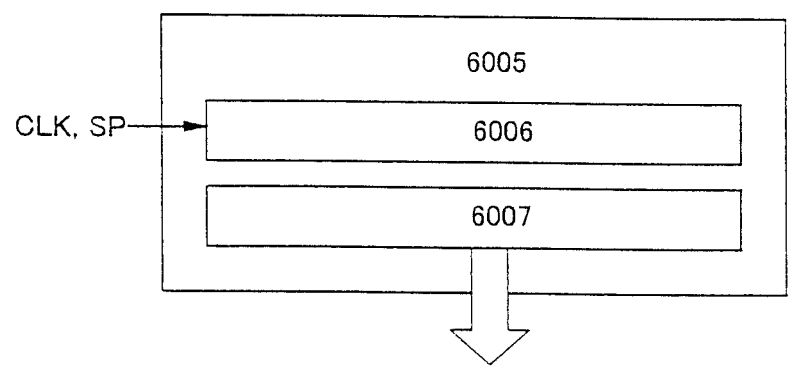

FIGS. 23A and 23B are block diagrams of driver circuits in the light emitting device of the present invention. FIG. 23A shows a source side driver circuit 6001 including a shift register 6002, a latch (A) 6003, and a latch (B) 6004.

In the source side driver circuit 6001, a clock signal (CLK) and a start pulse (SP) are inputted to the shift register 6002. The shift register 6002 generates a timing signal in succession in accordance with the clock signal (CLK) and the start pulse (SP). The timing signal is inputted in succession to a post-circuit through a buffer and the like (not shown)

The timing signal from the shift register 6002 is buffer-amplified by the buffer and the like. Since a large number of circuits or elements are connected with a wiring to which the timing signal is inputted, the wiring has a large load capacitance (parasitic capacitance). The buffer is provided to prevent "slowing" of rising or falling of the timing signal, which is caused due to the large load capacitance. Note that the buffer is not necessarily provided.

The timing signal buffer-amplified by the buffer is inputted to the latch (A) 6003. The latch (A) 6003 includes latches in a plurality of stages for processing digital video signals of n-bits. When the timing signal is inputted, the latch (A) 6003 captures in succession the digital video signals of n-bits, which is inputted from the outside of the source side driver circuit 6001 and holds it.

Note that, when the digital video signals are captured into the latch (A) 6003, they may be inputted in succession to the latches in the plurality of stages, which is included in the latch (A) 6003. However, the present invention is not limited to this structure. So called divisional drive in which the latches in the plurality of stages which are included in the latch (A) 6003 are divided into some groups and then the digital video signals are simultaneously inputted in each group may be performed. Note that the number of groups in this time is called the number of divisions. When the latches are divided by, for example, four stages to make groups, it is said that divisional drive with four divisions is performed.

A period until writing of the digital video signals into the latches in all stages of the latch (A) 6003 is completed is called a line period. Actually, there is the case where a line period includes a period obtained by adding a horizontal retrace period to the above line period.

When one line period is completed, latch signals are inputted to the latch (B) 6004. At this point, all the digital video signals which are written into the latch (A) 6003 and held thereby are sent to the latch (B) 6004, written into latches in all stages of the latch (B) 6004 and held.

Writing of digital video signals into the latch (A) 6003 which completely sent the digital video signals to the latch (B) 6004 is performed in succession in accordance with the timing signal from the shift register 6002.

During the second one line period, the digital video signals which are written into the latch (B) 6004 and held are inputted to the source signal lines.

FIG. 23B is a block diagram indicating a structure of the gate side driver circuit.

A gate side driver circuit 6005 includes a shift register 6006 and a buffer 6007. If necessary, it may further include a level shifter.

In the gate side driver circuit 6005, a timing signal from the shift register 6006 is inputted to the buffer 6007 and then inputted to a corresponding gate signal line. The gate electrodes of switching TFTs in pixels corresponding to one line are connected with the gate signal line. Since it is required that all the switching TFTs in the pixels corresponding to one line are turned on, a buffer capable of flowing a large current is used.

This embodiment can be embodied by being freely combined with Embodiments 1 to 12.

Embodiment 14

In this embodiment, an external light emitting quantum efficiency can be remarkably improved by using an organic compound material by which phosphorescence from a triplet exciton can be employed for emitting a light. As a result, the power consumption of the light-emitting element can be reduced, the lifetime of the light-emitting element can be elongated and the weight of the light-emitting element can be lightened.

The following is a report where the external light emitting quantum efficiency is improved by using the triplet exciton (T. Tsutsui. C. Adachi. S. Saito. Photochemical processes in Organized Molecular Systems, ed. K. Honda. (Elsevier Sci. Pub. Tokyo. 1991) p. 437).

The molecular formula of an organic compound material (coumarin pigment) reported by the above article is represented as follows.

Chemical formula 1

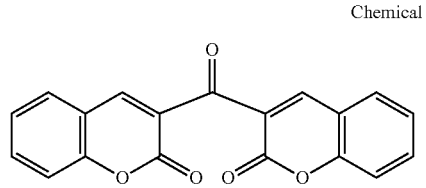

(M. A. Baldo. D. F. O'Brien. Y. You. A. Shoustikov, S. Sibley. M. E. Thompson. S. R. Forrest. Nature 395 (1998) p. 151)

The molecular formula of an organic compound material (Pt complex) reported by the above article is represented as follows.

Chemical formula 2

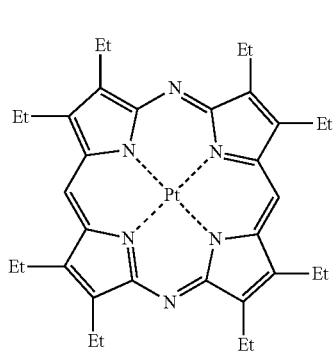

(M. A. Baldo, S. Lamansky. P. E. Burrows, M. E. Thompson, S. R. Forrest. Appl. Phys. Lett. 75 (1999) p. 4.)

(T. Tsutsui, M.-J. Yang, M. Yahiro. K. Nakamura. T. Watanabe. T. Tsuji, Y. Fukuda. T. Wakimoto. S. Mayaguchi. Jpn. Appl. Phys. 38 (12B) (1999) L1502)

The molecular formula of an organic compound material (Ir complex) reported by the above article is represented as follows.

Chemical formula 3

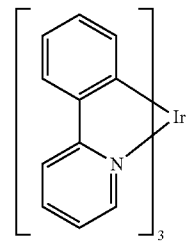

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of Embodiments 1 to 13.

Embodiment 15

In this embodiment, an example in which a source signal line or a power supply line is formed by a printing method using a low resistance material will be described.

Figure 25:
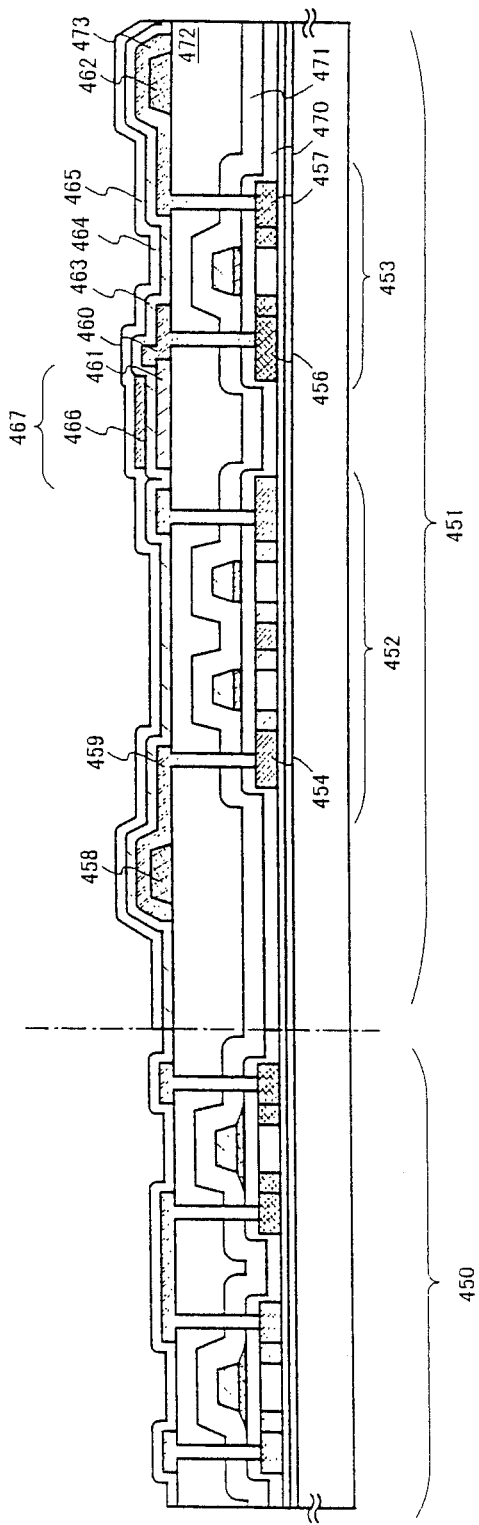
FIG. 25 is a cross sectional view of a light emitting device.

FIG. 25 is a cross sectional view of a light emitting device of this embodiment. The light emitting device has a driver circuit 450 and a pixel portion 451. The pixel portion 451 includes a switching TFT 452 and a current control TFT 453.

In this embodiment, at least one of a source signal line 458 and a power supply line 462 or both are formed by a printing method. Although a screen printing method is used in this embodiment, an intaglio printing method using a drum to be rotated, an intaglio printing method, and various offset printing methods can be applied to the present invention. Such a printing method is relatively low in cost and can be used in the case of a large area and thus suitable to the present invention.

In this embodiment, the source signal line 458 and the power supply line 462 are made of Cu. Note that a material for a wiring formed by a printing method has desirably a lower resistance than a wiring, or an electrode, which is formed by patterning.

Next, a pixel electrode 461 made from a transparent conductive film is formed on a second interlayer insulating film 472.

Further, a gate insulating film 470, a first interlayer insulating film 471, and a second interlayer insulating film 472 are etched to form contact holes which reach an impurity region 454 of the switching TFT 452 and impurity regions 456 and 457 of the current control TFT 453.

Further, a conductive film is formed on the second interlayer insulating film 472 and patterned to form electrodes 459, 460, and 473. The electrode 459 covers the entire surface or a portion of the source signal line 458 to make the contact. Note that, in this embodiment, the electrode 459 covers the entire surface of the source signal line 458. With this structure, entrance of a material for the source signal line 458 into an organic compound layer 463 can be prevented and a break easy to be caused in a printing method (screen printing) can be prevented. Note that, in this embodiment, the electrodes 459, 460, and 473 are made of a material having higher patterning precision than the source signal line 458 and the power supply line 462, which are formed by the printing method. In this embodiment, the electrodes are made from a laminate film of Ti/Al/Ti.

The electrode 459 is connected with the impurity region 454 of the switching TFT 452. The electrode 460 is connected with the pixel electrode 461 and thus electrically connects between the impurity region 456 of the current control TFT 453 and the pixel electrode 461.

The electrode 473 covers the entire surface or a portion of the power supply line 462 to make the contact. Note that, in this embodiment, the electrode 473 covers the entire surface of the power supply line 462. With this structure, entrance of a material for the power supply line 462 into the organic compound layer 463 can be prevented.

Further, the organic compound layer 463 is formed on the second interlayer insulating film 472 to cover the electrodes 459, 460, and 473 and the pixel electrode 461. Further, a counter electrode 466 is formed on the organic compound layer using a metal mask. Note that an overlapped region among the pixel electrode 461, the organic compound layer 463. and the counter electrode 466 corresponds to a light emitting element 467.

As described above, the source signal line or the power supply line in the pixel portion can be formed by various methods. When the resistance of the source signal line or the power supply line is reduced, a light emitting device having a large screen size and a high image quality can be realized.

Note that the structure of this embodiment can be embodied by being freely combined with any structures of Embodiments 1 to 13.

Embodiment 16

The light-emitting device has superior visibility in bright locations in comparison to a liquid crystal display device because it is of a self-luminous type, and moreover viewing angle is wide. Accordingly, it can be used as a display portion for various electronic instruments.

The following can be given as examples of such electronic instruments; a video camera; a digital camera; a goggle type display (head mounted display); a car navigation system; an audio reproducing device (such as a car audio system, an audio compo system); a laptop computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the light-emitting device is employed. Examples of these electronic instruments are shown in FIG. 24.

Figure 24A:
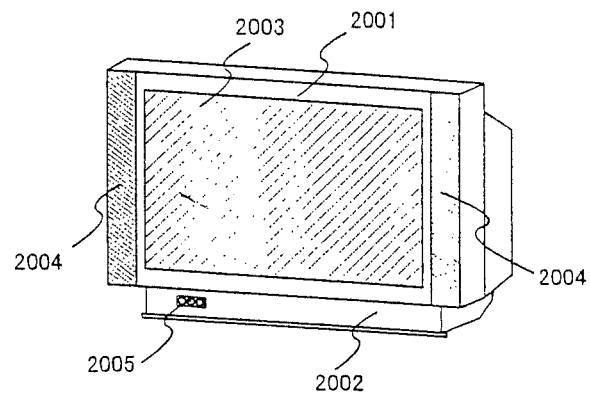
FIGS. 24A to 24C show electronic devices.

FIG. 24A illustrates an electro-luminescence display device which includes a frame 2001, a support table 2002, a display portion 2003, a speaker portion 2004, a video input terminal 2005, or the like. The light-emitting device of the present invention can be used as the display portion 2003. The light-emitting device is of a self-luminous type and therefore requires no back light. Thus, the display portion thereof can have a thickness thinner than that of the liquid crystal display device. The electro-luminescence display device is including all information display devices such as for a personal computer, for a TV broadcast receiving, for an advertising display or the like.

Figure 24B:
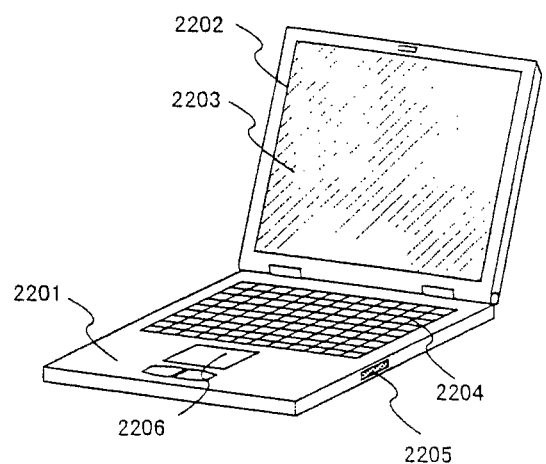

FIG. 24B illustrates a laptop computer which includes a main body 2201, a frame 2202, a display portion 2203, a key board 2204, an external connection port 2205, a pointing, mouse 2206 or the like. The light-emitting device in accordance with the present invention can be used as the display portion 2203.

Figure 24C:
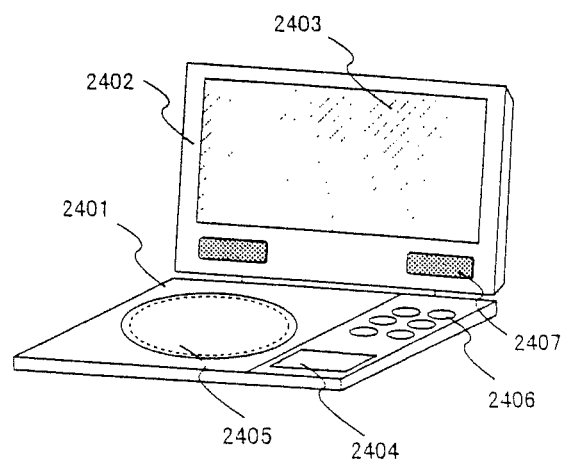

FIG. 24C illustrates an image reproduction apparatus which includes a recording medium (more specifically, a DVD reproduction apparatus), which includes a main body 2401, a frame 2402, a display portion A 2403, a display portion B 2404, a recording medium (a DVD or the like) 2405, operation switches 2406, a speaker portion 2407 or the like. The display portion A 2403 is used mainly for displaying image information, while the display portion B 2404 is used mainly for displaying character information. The electro-optical device in accordance with the present invention can be used as these display portions A 2403 and B 2404. The image reproduction apparatus including a recording medium further includes a domestic game equipment or the like.

Note that if emission luminance of an organic compound material becomes higher in the future, it will be applicable to a front-type or rear-type projector in which light including output image information is enlarged by means of lenses or the like to be projected.

The above mentioned electronic instruments are more likely to be used for display information distributed through a telecommunication path such as Internet, a CATV (cable television system), and in particular likely to display moving picture information. The light-emitting display device is suitable for displaying moving pictures since the organic compound material can exhibit high response speed.

Further, since a light-emitting portion of the light-emitting device consumes power, it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or an audio reproducing device, it is desirable to drive the light-emitting device so that the character information is formed by a light-emitting portion while a non-emission portion corresponds to the background.

As set forth above, the present invention can be applied variously to a wide range of electronic instruments in all fields. The electronic instruments in the present embodiment may use a light-emitting device having any one of configurations shown in Embodiments 1 to 15.

According to the present invention, even when an area of the pixel portion is expanded to make a large screen, preferable display can be realized in a light emitting device which is presented by the active matrix light emitting device. Since the resistance of the source signal line in the pixel portion is greatly reduced, the present invention can be applied to a large screen of, for example, 40 inches or 50 inches in diagonal.

What is claimed is:

1. A light emitting device comprising:
a pixel portion including a thin film transistor, a wiring, and a power source line formed over a substrate; and
a terminal portion provided on periphery of the pixel portion,
wherein the wiring is configured to transmit a video signal, and the wiring is electrically connected to one of source or drain of the thin film transistor,
wherein each of the wiring and the power source line includes a first conductive film and a second conductive film laminated on the first conductive film,
wherein the first conductive film includes titanium and the second conductive film includes copper, wherein the terminal portion includes a terminal including a third conductive film and a fourth conductive film laminated on the third conductive film, and wherein the third conductive film includes titanium and the fourth conductive film includes copper.

2. The light emitting device according to claim 1, wherein the first conductive film and the third conductive film include molybdenum.

3. The light emitting device according to claim 1, wherein the other of source and drain of the thin film transistor is electrically connected to a pixel electrode in the pixel portion.

4. The light emitting device according to claim 1, wherein the wiring is a source signal line.

5. The light emitting device according to claim 1, wherein the second conductive film and the fourth conductive film cover the first conductive film and the third conductive film, respectively.

6. The light emitting device according to claim 1, wherein the power supply line is electrically connected to the terminal.

7. A light emitting device comprising:
a pixel portion including a thin film transistor, a wiring, and a power source line formed over a substrate; and
a terminal portion provided on periphery of the pixel portion,
wherein the wiring is configured to transmit a video signal, and the wiring is electrically connected to one of source or drain of the thin film transistor,
wherein each of the wiring and the power source line includes a first conductive film and a second conductive film laminated on the first conductive film,
wherein the first conductive film includes titanium and the second conductive film includes copper,
wherein the terminal portion includes a terminal including a third conductive film and a fourth conductive film laminated on the third conductive film,
wherein the third conductive film includes titanium and the fourth conductive film includes copper, and
wherein the wiring is separated from the terminal portion.

8. The light emitting device according to claim 7, wherein the first conductive film and the third conductive film include molybdenum.

9. The light emitting device according to claim 7, wherein the other of source and drain of the thin film transistor is electrically connected to a pixel electrode in the pixel portion.

10. The light emitting device according to claim 7, wherein the wiring is a source signal line.

11. The light emitting device according to claim 7, wherein the second conductive film and the fourth conductive film cover the first conductive film and the third conductive film, respectively.

12. The light emitting device according to claim 7, wherein the power supply line is electrically connected to the terminal.

13. A light emitting device comprising:
a pixel portion including a thin film transistor, a wiring, and a power source line formed over a substrate; and
a terminal portion provided on periphery of the pixel portion,
wherein the wiring is configured to transmit a video signal, and the wiring is electrically connected to one of source or drain of the thin film transistor,
wherein each of the wiring and the power source line includes a first conductive film and a second conductive film laminated on the first conductive film,
wherein the first conductive film includes titanium and the second conductive film includes copper,
wherein the terminal portion includes a terminal including a third conductive film and a fourth conductive film laminated on the third conductive film,
wherein the third conductive film includes titanium and the fourth conductive film includes copper, and
wherein the wiring is electrically connected to the terminal.

14. The light emitting device according to claim 13, wherein the first conductive film and the third conductive film include molybdenum.

15. The light emitting device according to claim 13, wherein the other of source and drain of the thin film transistor is electrically connected to a pixel electrode in the pixel portion.

16. The light emitting device according to claim 13, wherein the wiring is a source signal line.

17. The light emitting device according to claim 13, wherein the second conductive film and the fourth conductive film cover the first conductive film and the third conductive film, respectively.

18. The light emitting device according to claim 13, wherein the power supply line is electrically connected to the terminal.

19. A light emitting device comprising:
a pixel portion including a thin film transistor, a wiring, and a power source line formed over a substrate; and
a terminal portion provided on periphery of the pixel portion,
wherein the wiring is configured to transmit a video signal, and the wiring is electrically connected to one of source or drain of the thin film transistor,
wherein each of the wiring and the power source line includes a first conductive film and a second conductive film laminated on the first conductive film,
wherein the first conductive film includes titanium and the second conductive film includes copper,
wherein the terminal portion includes a terminal including a third conductive film and a fourth conductive film laminated on the third conductive film,
wherein the third conductive film includes titanium and the fourth conductive film includes copper,
wherein the wiring is separated from the terminal portion, and
wherein the wiring is electrically connected to the terminal.

20. The light emitting device according to claim 19, wherein the first conductive film and the third conductive film include molybdenum.

21. The light emitting device according to claim 19, wherein the other of source and drain of the thin film transistor is electrically connected to a pixel electrode in the pixel portion.

22. The light emitting device according to claim 19, wherein the wiring is a source signal line.

23. The light emitting device according to claim 19, wherein the second conductive film and the fourth conductive film cover the first conductive film and the third conductive film, respectively.

24. The light emitting device according to claim 19, wherein the power supply line is electrically connected to the terminal.

* * * * *

UNITED STATES PATENT AND TRADEMARK OFFICE
CERTIFICATE OF CORRECTION

Page 1 of 2

PATENT NO. : 8,735,909 B2
APPLICATION NO. : 13/224363
DATED : May 27, 2014
INVENTOR(S) : Shunpei Yamazaki et al.

It is certified that error appears in the above-identified patent and that said Letters Patent is hereby corrected as shown below:

In the Specification

Column 1, line 33, after "for" delete ",";

Column 4, line 19, after "method" insert --of--;

Column 4, line 27, after "electroplating" delete ",";

Column 8, line 50, after "$SiH_4$" replace "." with --,--;

Column 12, line 35, after "1" delete ".";

Column 13, line 27, after "using" delete ".";

Column 17, line 18, after "cutting" delete ",";

Column 17, line 33, after "adhering" delete ",";

Column 17, line 50, replace "EDMOS" with --EEMOS--;

Column 21, line 37, after "annealing" delete ",";

Column 21, line 39, after "Then" replace "." with --,--;

Column 21, line 67, after "using" delete ".";

Column 22, line 36, after "Next" replace "." with --,--;

Column 24, line 14, after "$N_2$" delete ",";

Signed and Sealed this
Seventeenth Day of February, 2015

Michelle K. Lee
*Deputy Director of the United States Patent and Trademark Office*

Column 29, line 9, after "Tsutsui" replace "." with --,-- after "Adachi" replace "." with --,-- and after "Saito" replace "." with --,--;

Column 29, line 11, after "Pub." insert --,-- and after "Tokyo" replace "." with --,--;

Column 29, lines 34-35, after "Baldo" replace "." with --,-- after "O'Berien" replace "." with --,-- after "You" replace "." with --,-- after Sibley replace "." with --,-- after Thompson replace "." with --,-- and after Forrest replace "." with --,--;

Column 29, lines 59-60, after "Lamansky" replace "." with --,-- and after "Forrest" replace "." with --,--;

Column 31, line 18, after "463" replace "." with --,--;

Column 31, line 38, after "instruments" replace ";" with --:--;

Column 31, line 67, after "pointing" delete ",".